US011463526B2

(12) United States Patent
Justin et al.

(10) Patent No.: US 11,463,526 B2
(45) Date of Patent: Oct. 4, 2022

(54) FUTURE PROOFING AND PROTOTYPING AN INTERNET OF THINGS NETWORK

(71) Applicant: INTEL CORPORATION, Santa Clara, CA (US)

(72) Inventors: Jerin C. Justin, San Jose, CA (US); Kumar Balasubramanian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 354 days.

(21) Appl. No.: 15/638,942

(22) Filed: Jun. 30, 2017

(65) Prior Publication Data
US 2018/0063250 A1    Mar. 1, 2018

Related U.S. Application Data

(60) Provisional application No. 62/379,339, filed on Aug. 25, 2016, provisional application No. 62/379,313, filed on Aug. 25, 2016.

(51) Int. Cl.
*H04L 67/125* (2022.01)
*G06F 11/30* (2006.01)
(Continued)

(52) U.S. Cl.
CPC .......... *H04L 67/125* (2013.01); *G06F 11/261* (2013.01); *G06F 11/3006* (2013.01);
(Continued)

(58) Field of Classification Search
CPC ..... H04L 67/125; H04L 67/025; H04L 67/42; H04L 67/12; G06F 11/3006;
(Continued)

(56) References Cited

U.S. PATENT DOCUMENTS

| 7,035,786 B1 | 4/2006 | Abu El Ata et al. |
| 2006/0059253 A1* | 3/2006 | Goodman ............ G06Q 10/10 709/223 |

(Continued)

FOREIGN PATENT DOCUMENTS

| CN | 103546536 A | 1/2014 |
| CN | 103997435 A | 8/2014 |

(Continued)

OTHER PUBLICATIONS

J. O. Kephart and D. M. Chess, "The vision of autonomic computing," in Computer, vol. 36, No. 1, pp. 41-50, Jan. 2003 (Year: 2003).*

(Continued)

*Primary Examiner* — Boris Gorney
*Assistant Examiner* — Michael Edward Cocchi
(74) *Attorney, Agent, or Firm* — Schwegman Lundberg & Woessner, P.A.

(57) ABSTRACT

A system and method for representing events that occur in a real world deployment is described. A real-world workload including multiple events is identified. Multiple characteristics of the real-world workload are converted into multiple endpoint simulator workloads. Multiple gateway hardware characteristics are converted into a modeling elements for simulated Internet of things (IoT) networks. Further, a simulation is performed for each of the endpoint simulator workloads on each of the simulated IoT networks. Also, statistics are collected about the performance of the simulated IoT networks for the endpoint simulator workloads.

25 Claims, 9 Drawing Sheets

(51) Int. Cl.
  *G06F 11/26* (2006.01)
  *H04L 67/025* (2022.01)
  *G06F 11/34* (2006.01)
  *H04L 67/01* (2022.01)
  *H04L 67/12* (2022.01)

(52) U.S. Cl.
  CPC ...... *G06F 11/3058* (2013.01); *G06F 11/3414* (2013.01); *G06F 11/3457* (2013.01); *H04L 67/025* (2013.01); *H04L 67/42* (2013.01); *H04L 67/12* (2013.01)

(58) Field of Classification Search
  CPC ............. G06F 11/3457; G06F 11/3058; G06F 11/3414; G06F 11/261
  See application file for complete search history.

(56) References Cited

U.S. PATENT DOCUMENTS

| | | | |
|---|---|---|---|
| 2006/0074970 A1* | 4/2006 | Narayanan | G06F 11/3476 707/999.102 |
| 2007/0083500 A1 | 4/2007 | Zibitsker | |
| 2010/0153330 A1* | 6/2010 | Desikachari | G06F 11/3433 706/59 |
| 2011/0153507 A1 | 6/2011 | Murthy et al. | |
| 2013/0261826 A1 | 10/2013 | Mandagere et al. | |
| 2015/0134954 A1 | 5/2015 | Walley et al. | |
| 2016/0065653 A1 | 3/2016 | Chen et al. | |
| 2016/0078383 A1* | 3/2016 | An | G06Q 10/06315 705/7.25 |
| 2016/0179993 A1 | 6/2016 | Maturana et al. | |
| 2016/0241641 A1* | 8/2016 | Mazor | H04L 12/2803 |
| 2017/0102978 A1* | 4/2017 | Pallath | H04L 67/12 |
| 2017/0235585 A1* | 8/2017 | Gupta | G06F 9/45558 718/1 |
| 2017/0310549 A1* | 10/2017 | Nagesh | H04L 43/16 |

FOREIGN PATENT DOCUMENTS

| | | |
|---|---|---|
| CN | 104699476 A | 6/2015 |
| CN | 109496416 | 3/2019 |
| WO | 2015052483 A1 | 4/2015 |
| WO | WO-2016118979 A2 | 7/2016 |
| WO | 2018039529 | 3/2018 |

OTHER PUBLICATIONS

P. Hoenisch, S. Schulte, S. Dustdar and S. Venugopal, "Self-Adaptive Resource Allocation for Elastic Process Execution," 2013 IEEE Sixth International Conference on Cloud Computing, 2013, pp. 220-227, (Year: 2013).*

PCT International Search Report, PCT Application No. PCT/US2017/048559, dated Dec. 4, 2017, 4 pages.

"Chinese Application Serial No. 201780046506.8, Office Action dated May 25, 2021", w/o English translation, 16 pgs.

"International Application Serial No. PCT US2017 048559, Written Opinion dated Dec. 4, 2017", 6 pgs.

"International Application Serial No. PCT US2017 048559, International Preliminary Report on Patentability dated Mar. 7, 2019", 8 pgs.

"Chinese Application Serial No. 201780046506.8, Response filed Oct. 11, 2021 to Office Action dated May 25, 2021", w English Claims, 21 pgs.

* cited by examiner

FUTURE PROOFING AND PROTOTYPING AN INTERNET OF THINGS NETWORK

CROSS REFERENCE TO RELATED APPLICATIONS

The present application claims the benefit of the filing date of U.S. Provisional Patent Application Nos. 62/379,313 and 62/379,339, filed Aug. 25, 2016, which are incorporated herein by reference.

TECHNICAL FIELD

The present techniques relate generally to Internet of Things (IoT) devices. More specifically, the present techniques relate to the field of IoT data propagation and analysis.

BACKGROUND

A current view of the Internet is as a connection of clients, such as personal computers, tablets, smart phones, servers, digital photo-frames, and many other types of devices to publicly-accessible data-centers hosted in server farms. However, this picture represents a small portion of the overall usage of the globally-connected network. A very large number of connected resources currently exist, but are not publicly accessible. Examples include corporate networks, private organizational control and monitoring networks spanning the globe, and peer-to-peer relays designed for anonymity.

It has been estimated that the Internet of Things (IoT) may bring a multi-fold increase in Internet connectivity in just a few years. For organizations, IoT devices may provide opportunities for monitoring, tracking, or controlling other devices and items, including further IoT devices, other home and industrial devices, items in manufacturing and food production chains, and the like. Further, the emergence of IoT networks has served as a catalyst for profound change in the evolution of the Internet. In the future, the Internet may evolve from an infrastructure that is oriented toward human utility, to an infrastructure where humans are minority actors in an Internet of increasing numbers of interconnected devices. Accordingly, the Internet may become a communications system for devices, and networks of devices, to not only communicate with data centers, but with each other. In the IoT, functional networks may be constructed to perform specific tasks, and then de-constructed once the task is completed. Challenges exist in enabling reliable, secure, and identifiable devices to form networks for specific tasks such as these, and various other types of tasks as may be implemented in the IoT.

DESCRIPTION OF THE EMBODIMENTS

Figure 1:
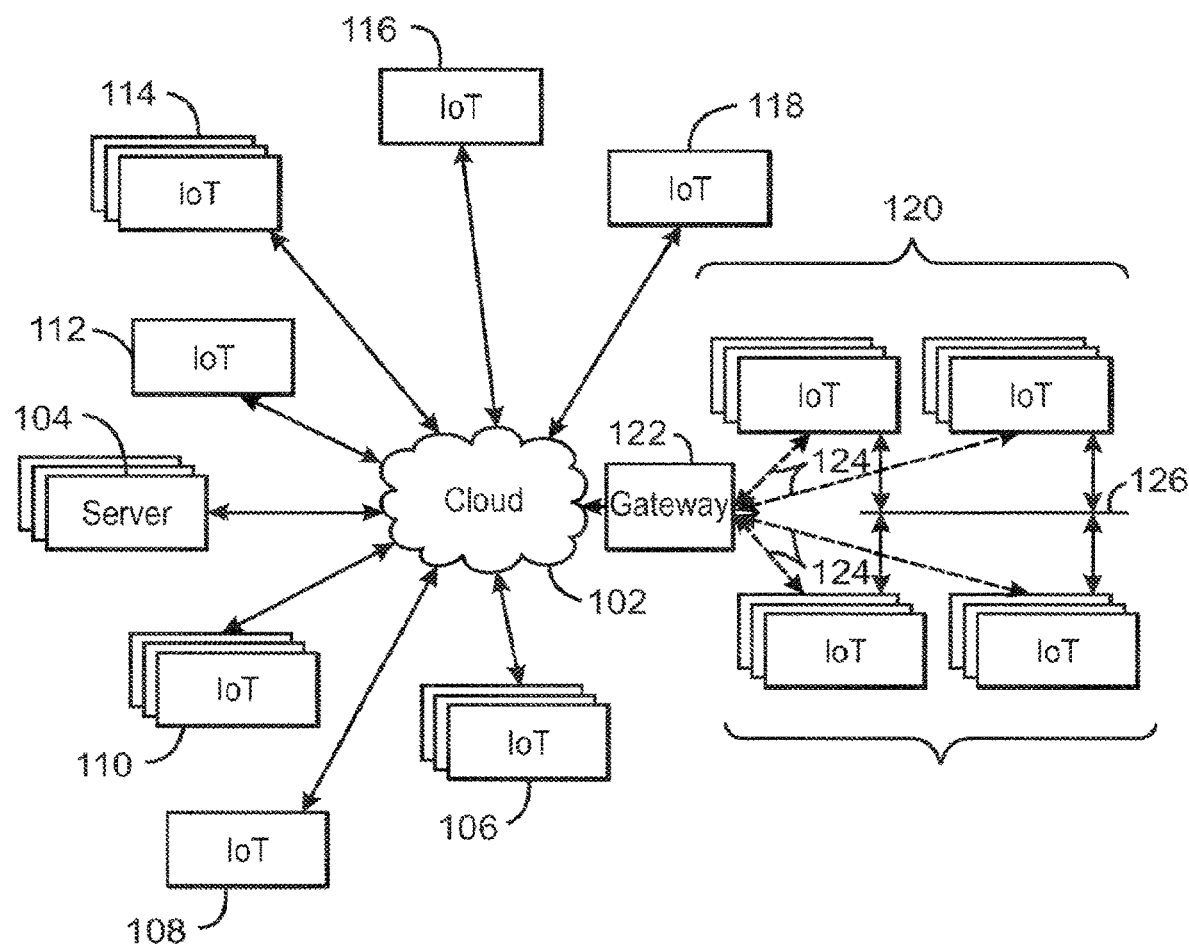
FIG. 1 is a drawing of an example Internet of Things (IoT) system.

The Internet of things (IoT) is a concept in which a large number of computing devices are interconnected to each other and to the Internet to provide functionality and data acquisition at very low levels. As used herein, an IoT device may include a semi-autonomous device performing a function. The function may include sensing or control, among others. The IoT device may communicate with other IoT devices and a wider network, such as the Internet. Example networks of IoT devices may include commercial and home automation devices, such as water distribution systems, electric power distribution systems, pipeline control systems, plant control systems, light switches, thermostats, locks, cameras, alarms, motion sensors, and the like. The IoT devices may be accessible through remote computers, servers, and other systems, to control systems or access data. Other IoT devices may include IoT gateways, which are used to couple IoT devices to other IoT devices, and to cloud applications. Cloud applications may include services, for example, such as data storage, process control, and the like.

The future growth of the Internet may include very large numbers of IoT devices, each with their own respective standards and configurations. Accordingly, as described herein, a number of innovations for the future Internet address the need for all these layers to grow unhindered, to discover and make accessible connected resources, and to support the ability to hide and compartmentalize connected resources. Any number of network protocols and communications standards may be used, wherein each protocol and standard is designed to address specific objectives. Further, the protocols are part of the fabric supporting human accessible services that operate regardless of location, time or space. The innovations include service delivery and associated infrastructure, such as hardware and software. The services may be provided in accordance with the Quality of Service (QoS) terms specified in service level and service delivery agreements.

Future innovations in the IoT may implicate new architectures that incorporate such innovations. Examples may rapidly prototype different potential configurations that can be future proofed by determining which configurations are efficient, cost-effective, and the like. Prototyping for an IoT network involves generating workloads on an IoT network that resemble real-world scenarios. Further, prototyping includes capturing these workloads in end-to-end IoT use case definitions and testing the use cases on an IoT network. Workloads are collections of workflows, which are series of events that take place on an IoT network. The end-to-end IoT use case definitions are thus characterized by workflows that exercise a number of software events and interrupts of varying priorities and dependencies. However, attempting to test workflows with real-world events in a real-world IoT network would be time consuming and expensive, thereby contributing to prototyping delays and rendering many potential prototype evaluations infeasible.

In current systems, prototyping may be carried out by evaluating characteristics of a small subset of real world clients and triggers that are not representative of real world workloads, which constitute multiple parallel triggers, thereby resulting in inaccurate and largely insufficient data points to carry out concept evaluations. Concept evaluations are methods for determining the feasibility of a new concept, such as a new gateway for an IoT network.

An IoT statistic characterization process that determines workload impact for current and estimated future workloads uses an IoT rapid prototyping engine. The IoT rapid prototyping engine enables the evaluation of statistic characteristics using accurate representations of real world client and triggers via simulated end point clients and external triggers. Further, embodiments of the claimed subject matter enable complex workflow and statistic characteristics analysis, thereby providing rapid prototyping capabilities.

Workloads are simulated incrementally from simple representations to scaled-up complex inputs on modelled edge gateway architectures, with the resulting statistic characteristics documented for offline evaluation. The outlined embodiments describe the evaluation of simulating the workflows on the modelled gateways and the resulting statistic characteristics. Statistic characterization represents an evaluation on a specific statistic that is to be tracked during simulation. For example, the RAM capacity, CPU use, buffer sizes, how many full buffers, round-trip latency, hop-to-hop latency, are some example statistics that may be tracked for the simulation of the prototype on a simulated IoT network.

FIG. 1 is an example Internet of Things (IoT) system 100. The system 100 includes a cloud 102, servers 104, multiple IoT devices 106, 108, 110, 112, 114, 116, 118, a group 120 of IoT devices, and a gateway 122. The cloud 102 may represent the Internet, or may be a local area network (LAN) or a wide area network (WAN), such as a proprietary network for a company. The server 104, various IoT devices 106, 108, 110, 112, 114, 116, 118, and gateway 122, may be real, virtual, or simulated. Indeed, the representations in FIG. 1 may be real or simulated with respect to their depiction and in evaluation, including in any hybrid operation of the live real IoT components with simulated or emulated components.

The network topology may include various types of IoT networks, such as a mesh network via Bluetooth® low energy (BLE) links. Other types of IoT networks may include a wireless local area network (WLAN) network to communicate with IoT devices through IEEE 802.11 (Wi-Fi®) links, a cellular network to communicate with IoT devices through an LTE/LTE-A (4G) or 5G cellular network, and a low-power, wide area (LPWA) network. A LPWA network may be compatible with the long range wide area network (LoRaWAN™) specification promulgated by the LoRa alliance. The network topology or IoT network(s) may include IPv6 over Low Power Wide-Area Networks (LP-WAN) network compatible with a specification promulgated by the Internet Engineering Task Force (IETF). Further, the respective IoT networks may communicate with an outside network provider (e.g., a tier 2 or tier 3 provider) via a variety of communications links, such as an LTE cellular link, an LPWA link, or a link based on the IEEE 802.15.4 standard, such as Zigbee®, and so on. The respective IoT networks may also operate by network and internet application protocols such as Constrained Application Protocol (CoAP). The respective IoT networks may also be integrated with coordinator devices that provide a chain of links that forms cluster tree of linked devices and networks.

Although wireless networks and wired networks are described, such as LPWA links, optical links, and the like, it may be noted that any type of network may be used to couple the devices to each other or to a gateway 122. A network or assembled group of devices may have both wired and wireless connections, and may use both simultaneously between nodes, peers, and gateway devices. Further the network or assembled group of devices may use wired networks, wireless networks, or both, to communicate with the cloud, and any higher performance computing devices that may be participating to deliver services or support to what is disclosed herein. Thus, any IoT link 108 or IoT network 112 may use a wired or wireless connection. Further, IoT devices may be in direct communications with other devices in the cloud 102 without the use of a gateway 122. The backbone links 108 may include various wired or wireless technologies, including optical networks and, again, may be part of a LAN, a WAN, or the Internet. Additionally, such communication links facilitate optical signal paths among both IoT devices with the cloud 102 and the gateway(s) 110, including the use of MUXing/deMUXing components that facilitate interconnection of the various devices.

As can be seen from FIG. 1, a large number of IoT devices may be communicating through the cloud 102. These IoT devices may be grouped in combinations to perform a common function, such as IoT devices for remote weather stations 106, local information terminals 108, alarm systems 110, automated teller machines 112, alarm panels 114, or moving vehicles, such as emergency vehicles 116 or drones 118, among many others. Each of these IoT devices may be in communication with other IoT devices, with servers 104, or both. The IoT devices 106, 108, 110, 112, 114, 116, 118 may include any number of different types of sensors, computing devices, and the like. The servers 104 may be one or more computing devices that provides a service for, or communicates in some other capacity with one or more IoT devices 106, 108, 110, 112, 114, 116, 118 and group 120. Moreover, in profiling and diagnostics, the servers 104 and the various IoT devices 106, 108, 110, 112, 114, 116, 118 may be real, virtual, or simulated.

In one example, the group 120 is a traffic control group that includes IoT devices along streets in a city. These IoT devices may include stoplights, traffic flow monitors, cameras, weather sensors, and the like. The IoT devices in the traffic control group may use another device, such as the gateway 122 to communicate with the cloud 102. The traffic control group, or other subgroups, may be in communication with the cloud 102 through wireless links 124, such as LPWA links, and the like. Further, a wired or wireless sub-network 126 may allow the IoT devices to communicate with each other, such as through a local area network, wireless local area network, and the like. In some examples, the sub-network 126 may couple one or more of the IoT devices to the gateway 122 using a wired network. Additionally, the IoT devices of the group 120 may also use one or more servers (not shown) operationally disposed along the gateway 122, or between the group 120 and the gateway 122, to facilitate communication of the group 120 with the cloud 102 or with the gateway 122. For example, the one or more servers may operate as an intermediate network node to support a local edge cloud or fog implementation among a local area network.

This may allow different IoT devices to request or provide information to other devices autonomously. For example, the traffic group 120 may request a current weather forecast from a group of remote weather stations 106, which may provide the forecast without human intervention. Further, an emergency vehicle 116 may be alerted by an automated teller machine 112 that a burglary is in progress. As the emergency vehicle 116 proceeds towards the automated teller machine 112, it may access the traffic group 120 to request clearance to the location, for example, by lights turning red to block cross traffic at an intersection in sufficient time for the emergency vehicle 116 to have unimpeded access to the intersection.

Clusters of IoT devices, such as the remote weather stations 106 or the traffic control group, may be equipped to communicate with other IoT devices as well as with the cloud 102. Moreover, in profiling and diagnostics, the weather stations 106 and the various IoT devices 108, 110, 112, 114, 116, 118 may be real, virtual, or simulated. This may allow the IoT devices to form an ad-hoc network or virtual network between the devices, allowing them to function as a single device, which may be termed a fog device. The fog device is discussed further with respect to FIG. 2.

Figure 2:
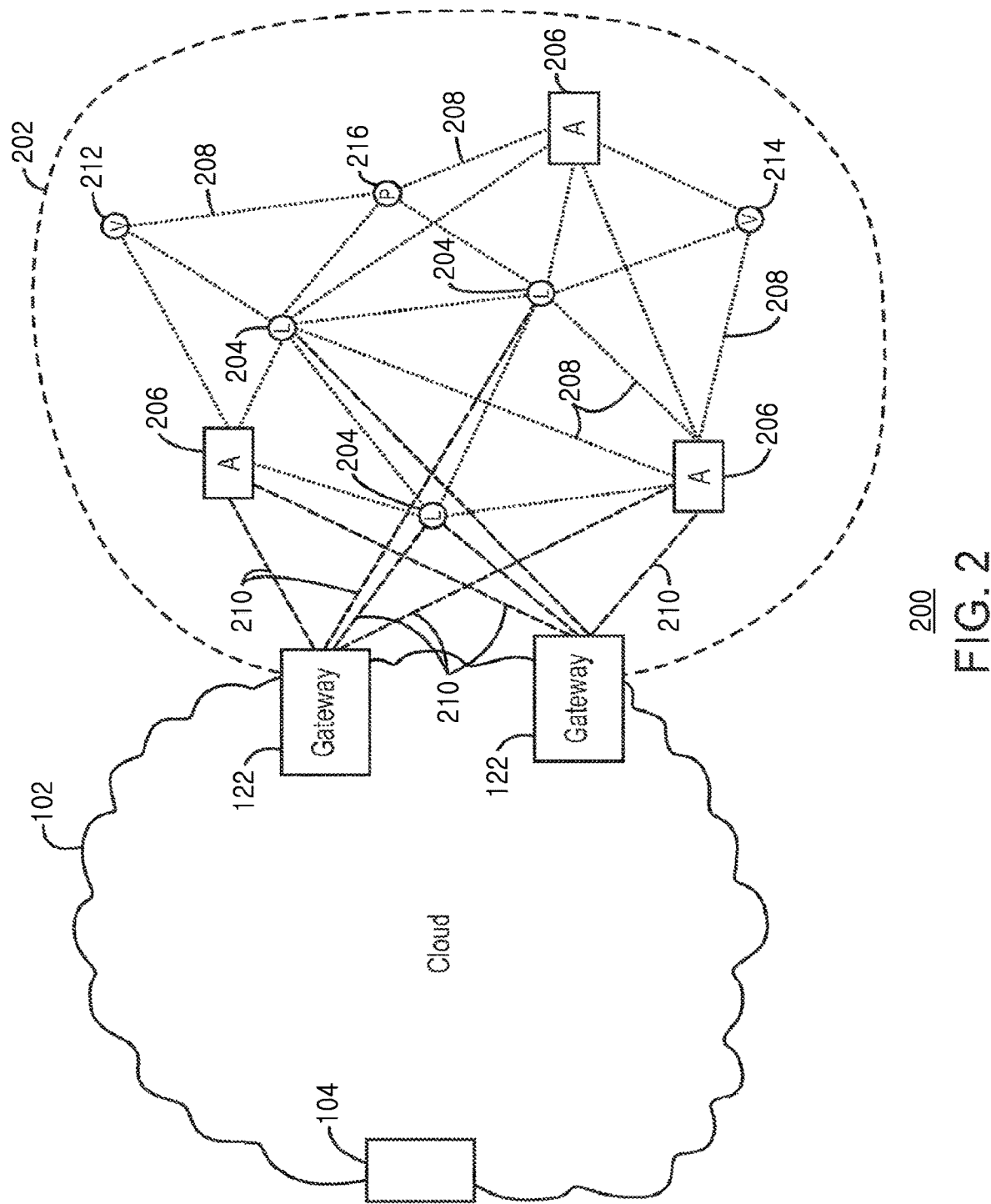
FIG. 2 is a drawing of an example IoT system for a mesh network of IoT devices.

FIG. 2 is an example IoT system 200 for a mesh network of IoT devices (fog device 202). In embodiments, the fog device 202 operates at the edge of the cloud 102. As used herein, the fog device 202 is a cluster of devices that may be grouped to perform a specific function, such as traffic control, weather control, plant control, home monitoring, and the like.

Although the fog device 202 is shown as a mesh network in this example, using gateways, such as gateway 122 to communicate with devices in the cloud 102, the devices do not have to be part of a mesh network, or even proximate to each other to form a fog device. Thus, the devices do not have to be in direct radio or network communications with each other, or proximate to each other, but may form an ad hoc group based on function. The formation of the fog device 202 may be as simple as sharing naming, type, and identification information, for example, group identity credentials, between the different devices forming the fog device. This may allow any device to act as a representative of the fog device 202, with providing identity specific to the device. As an example, although the fog device 202 is this example is shown as being made up of devices in a single location, fog devices can include devices in multiple locations, formed to provide specific services. For example, the fog device 202 may include remote weather stations located in the cloud 102. Further, a server 104 located in a data center may be included in the fog device 102 for data analysis, and other services. Moreover, in profiling and diagnostics, the cloud 102, server 104, fog device 202 and the various remote weather stations, may be real, virtual, or simulated.

In another example, the fog device 202 is a group of IoT devices for regulating traffic at an intersection. The fog device 202 may be established in accordance with specifications released by the OpenFog Consortium (OFC), among others. These specifications allow the formation of a hierarchy of computing elements between the gateways 122 coupling the fog device 202 to the cloud 102 and endpoint devices, such as traffic lights 204 and data aggregators 206 in this example. The fog device 202 can leverage the combined processing and network resources that the collective of IoT devices provides.

Traffic flow through the intersection may be controlled by a plurality of traffic lights 204 (e.g., three traffic lights 204). Analysis of the traffic flow and control schemes for traffic may be implemented by aggregators 206 that are in communication with the traffic lights 204 and each other through a mesh network. Data may be uploaded to the cloud 102, and commands may be received from the cloud 102, through gateways 122 that are in communication with the traffic lights 204 and the aggregators 206 through the mesh network. In some aspects, the fog device 202 can include temporary IoT devices. In other words, not all of the IoT devices in the mesh network may be permanent members of the fog device 202. In the example IoT system 200, three transient IoT devices have joined the fog device 202, a first vehicle 212, a second vehicle 214, and a pedestrian 216. In these cases, the IoT device may be built into the vehicles 212 and 214, or may be an App on a cell phone carried by the pedestrian 216. Moreover, in profiling and diagnostics, the cloud 102, server 104, gateways 122, fog device 202, traffic lights 204, aggregators 206, vehicles 212, 214, pedestrians 214, and the like, may be real, virtual, or simulated.

The fog device 202 may be considered to be an interconnected network wherein a number of IoT devices are in communications with each other, for example, by the communication links 208 and 210, through the cloud 102 via a network communications link, or through a gateway 122. For devices proximate to one another, the network may be established using the open interconnect consortium (OIC) standard specification 1.0 released by the Open Connectivity Foundation™ (OCF) on Dec. 23, 2015. This standard allows devices to discover each other and establish communications for interconnects. Other interconnection protocols may also be used, including, for example, the optimized link state routing (OLSR) Protocol, or the better approach to mobile ad-hoc networking (B.A.T.M.A.N.), among many others. Any number of communications links may be used in the fog device 202. Shorter-range links 208, for example, compatible with IEEE 802.15.4 may provide local communications between IoT devices that are proximate to the intersection. Longer-range links 210, for example, compatible with LPWA standards, may provide communications between the IoT devices and the gateways 122. To simplify the diagram, not every communications link 208 or 210 is labeled with a reference number. Further, not every device that participates in the fog device 202 needs to be located proximate to the other devices or in direct radio communications. For example, the fog device 202 may incorporate a weather station located on a different network.

One or more of the communications links 208 and 210 may be replaced with a wired connection between two devices. The network forming the fog device 202 does not have to be a mesh network, but may be a standard network in which each device is coupled to other devices through a wired or wireless connection to the gateway 122.

In some aspects, communications from any IoT device 204, 206, 212, 214, 216 may be passed along the most convenient path between any of the IoT devices 204, 206, 212, 214, 216 to reach the gateways 122, for example, the path having the fewest number of intermediate hops, or the highest bandwidth, among others. In mesh networks, the number of interconnections provides substantial redundancy, allowing communications to be maintained, even with the loss of a number of IoT devices.

The fog device 202 of the devices may be presented to clients in the cloud 102, such as the server 104, as a single device located at the edge of the cloud 102. In this example, the control communications to specific resources in the fog device 202 may occur without identifying any specific IoT device within the fog device 202. Accordingly, if an IoT device fails, other IoT devices may be able to discover and control a resource. For example, the traffic lights 204 may be wired so as to allow any one of the traffic lights 204 to control lights for the other traffic lights 204.

In some examples, the IoT devices 204, 206, 212, 214, 216 may be configured using an imperative programming style, e.g., with each IoT device having a specific function and specific communication partners. However, in some embodiments, the IoT devices 204, 206, 212, 214, 216 forming the fog device 202 may be configured in a declarative programming style, allowing the IoT devices 204, 206, 212, 214, 216 to reconfigure their operations and communications, such as to determine needed resources in response to conditions, queries, device failures, and the like. For example, as transient IoT devices, such as the vehicles 212, 214 and the pedestrian 216, join the fog device 202, the fog device 202 may modify the operation of the fog device 202. In one example, a temporary group including the vehicles 212, 214 and the pedestrian 216 may be formed. The temporary group may modify the operation of the traffic lights 204 so the pedestrian 216 has sufficient time to cross the intersection. To address safety concerns, if one or both of the vehicles 212, 214 are autonomous, the temporary group may modify the operation of any autonomous vehicles to slow down prior to arriving at the intersection. Further, as the transient devices 212, 214, 216, leave the vicinity of the intersection, the fog device 202 may reconfigure itself to eliminate the IoT devices 212, 214, 216 from the network. As other transient IoT devices approach the intersection, the fog device 202 may reconfigure itself to include those devices, and so on.

Embodiments of a traffic system in the IoT, such as the IoT system 200, may have other types of configurations as well. For example, the fog device 202 may include the traffic lights 204 for a number of intersections, such as along a street, along with all of the transient IoT devices along the street. The fog device 202 may then divide itself into functional units, such as the traffic lights 204 and other IoT devices proximate to a single intersection. This type of combination may enable the formation of larger IoT constructs in the fog device 202. Hence, if an emergency vehicle joins the fog device 202, an emergency construct, or virtual device, may be created that includes all of the traffic lights 204 for the street, allowing control of the traffic flow patterns for the entire street. The emergency construct may instruct the traffic lights 204 along the street to stay red for opposing traffic, and green for the emergency vehicle, expediting the passage of the emergency vehicle.

IoT systems such as, the IoT system 200, may be complex and hence, may provide a number of challenges in their implementations. For example, IoT systems may include numerous types of devices, communication links, protocols, and the like, which may be configured in a number of different potential implementations. Thus, determining what configurations are available, and which of those configurations accommodate the IoT system requirements may be challenging. Accordingly, certain embodiments provide for a system to perform simulations of potential IoT systems (prototypes), on the IoT system itself.

For instance, simulation code may be stored and executed on the fog device 202, or on other devices in an IoT system, such as the data aggregators 206 of the fog device 202. The simulation may perform various simulated configurations of an IoT system. Simulations may include different workloads on the existing IoT architecture giving resulting statistic characteristics. In some examples, the simulation system disposed in the IoT system may iterate through simulated incremental values of workload values, architecture or gateway values, and observed statistic characteristics values. In particular examples, the simulations may provide for reconfiguring a fog device 202, for example, by modelling a change in which IoT devices are used to provide particular functions.

Moreover, an IoT simulation system may be installed and executed on an existing fog device 202, or on other devices in an IoT system. The installation of the IoT simulation system may allow for the creation of a virtual IoT device that includes both virtual and real IoT devices. The virtual and real IoT devices thus represent a hybrid system architecture, where simulation of a proposed future architecture and a live architecture run at the same time on the same virtual machine. The virtual IoT device may allow for testing different configurations of IoT devices, for example, before adding additional IoT devices to a fog device 202 or reconfiguring communications in a fog device 202. The test results may represent functionality, stability, and the like, as the configuration changes. Moreover, in profiling and diagnostics, the cloud 102, server 104, gateways 122, fog device 202, traffic lights 204, aggregators 206, and the like, may be real, virtual, or simulated. Furthermore, components shown in FIG. 2, such as the gateway, fog device, and various sensors or servers, may be real, virtual, or simulated. Indeed, the representations in FIG. 2 may be real or simulated with respect to their depiction and in evaluation, including in any hybrid operation of the live real IoT components with simulated or emulated components.

Indeed, the simulations for evaluating or detecting anomalies may run and operate in an environment where both live IoT systems and the simulation/emulation are running together to consider, for example, an expansion of an IoT system by testing the proposed architecture. Thus, embodiments may include a hybrid of live and simulated/emulated systems. This hybrid set-up may accommodate opportunity to test, for example, system capacity and fault recovery scenarios.

Figure 3:
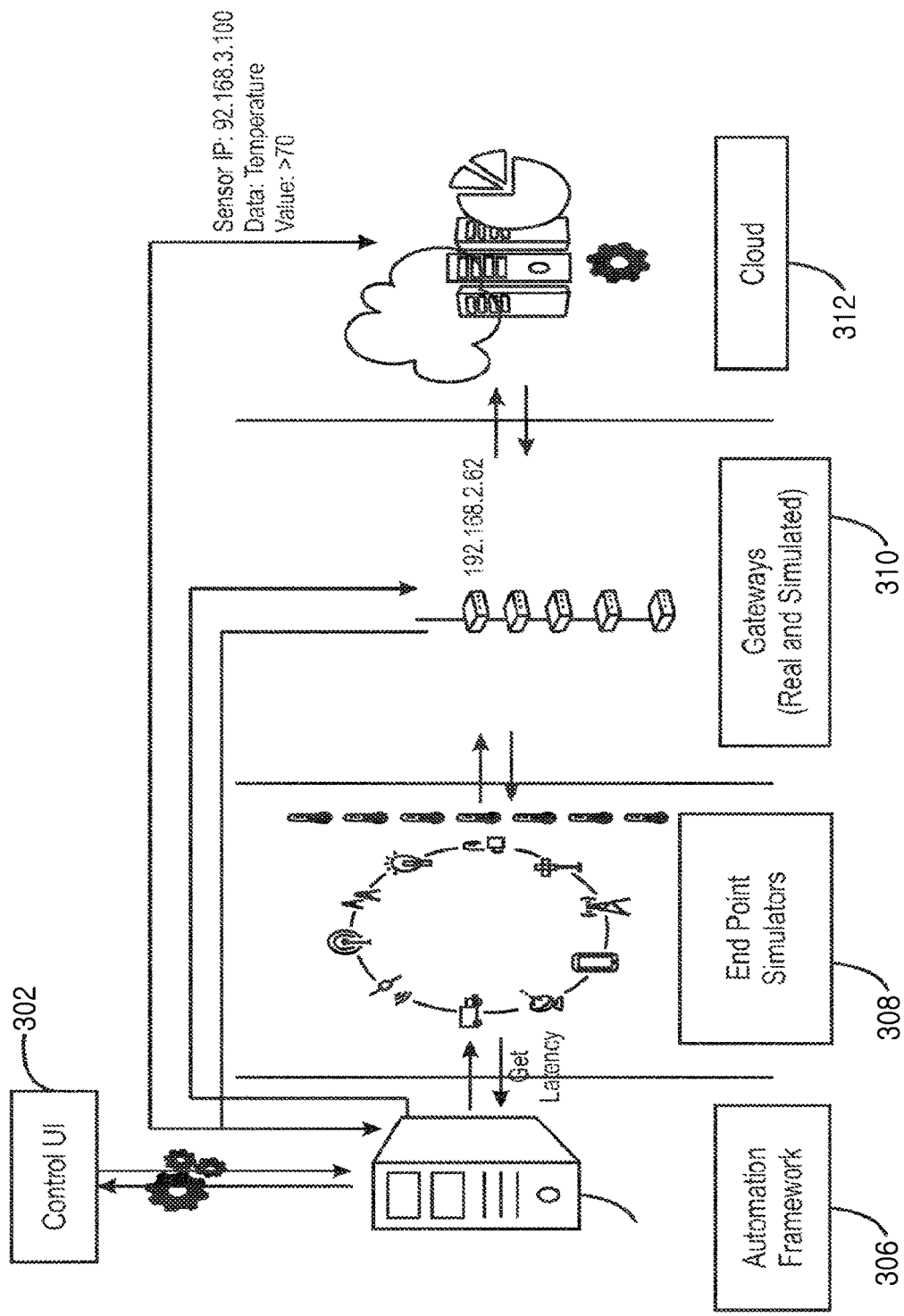
FIG. 3 is diagram of an example IoT system for rapid prototyping.

FIG. 3 is an example IoT system 300 for rapid prototyping. The system 300 includes a control user interface (UI) 302 (installed on a computing device 304), an automation framework 306 and end point simulators 308 (also installed on computing device 304), real and simulated gateways 310 (simulated gateways installed on computing device 304), and the cloud 312. Moreover, in profiling and diagnostics, the IoT system 300, control UI 302, computing device 304, automation framework 306, endpoint simulators 308, gateways 310, and the cloud 312 may be real, virtual, or simulated.

The control UI 302 may be used to create a simulated IoT system on which to execute the workloads. The simulated IoT network is defined using configuration parameters such as the number of sensors, sensor publish frequencies, packet sizes, burstiness of the traffic profiles, quality of service (QoS) values of merge queueing telemetry transport (MQTT) based transmissions, are a few examples of parameters to define a simulated IoT network. The control UI 302 has the ability to dynamically modify runtime parameters, which gives the edge infrastructure the ability to accurately represent real world scenarios. Dynamically modifying runtime parameters means using the control UI 302 to take an event generated by the end point simulators 308, and changing the sensed value. Modifications can happen during run time execution of the simulated model. The control UI 302 initiates monitoring daemons in each of the devices the control UI 302 controls, e.g., the simulated sensors and sensor hubs, the gateways 310, and servers in the cloud 312. The monitoring daemons track the statistics used to characterize a prototype simulation. In one embodiment, monitoring daemons can be run on the cloud 312 to monitor the receipt of sensed values, the subsequent analysis, and actuation.

The end point simulators 308 generate events for the simulated workload based on models of the different types of events that occur. The type of event generated depends on what the components of the simulated IoT network do. One example of an event is when any of the sensors transmits a measurement or other sensed value via Bluetooth to an aggregator. Another example event is the number of transient devices expected to join or leave the mesh network per unit of time. The end point simulators 308 include models for various types of communication protocols used by sensors in an IoT network. The values may be determined randomly.

The automation framework 306 is used to perform the simulation of processing the workload in the simulated IoT network. In one embodiment, the automation framework 306 inputs events generated by the end point simulators 308 to a simulated IoT network. More specifically, the automation framework 306 issues control sequences to end point devices, real and simulated, via the control UI 302. During a learning phase where the event models are built, the control sequences to the end points are issued for the purposes of learning the resultant statistic characteristics. During the run phase, the end point simulators 308 are controlled for the purpose of predicting expected statistic characteristics. The edge infrastructure provides API's for canned trigger scripts to interact. The set of API's exchange a standard set of timing information that allows the trigger scripts to identify synchronous versus staggered starts. These scripts may be stored anywhere in the edge infrastructure, or even the cloud 312. However, storing the scripts closest to the edge is more efficient than at the gateways 310 and the cloud 312.

The real and simulated gateways 310 are used for different purposes. The real gateways are used to collect statistic characteristics information during the learning phase of the model building. The data is then used to build the simulated IoT network, i.e., the simulation model, wherein gateways 310 and end points are simulated entities. The simulated gateways process the events generated by the end point simulators 308, and pass the sensor information to the cloud 312. Once the simulation is executed, the statistics tracked by the monitoring daemons are stored in an IOT database.

The IoT database is an integrated database that stores workflow configuration parameters, results logging, and enables binary searches and pruning based on results from prior runs. Interactions with the database are controlled via the control UI 302. This arrangement allows for the security and integrity of the stored data. Allowing the database values to only be controlled via the control UI 302 allows for fewer entry points and a single point to protect against threats, such as malicious users, viruses, etc. Workflow configuration information, observed system performance, and the resulting statistic characteristics are stored in each tuple in the IoT database. In this way, the IoT database may enable the building of functions that extrapolate statistic characteristics and system performance for a range of incremental workload parameters, which may give the edge architecture the capability of being able to run thousands of permutations to identify the most optimal hardware or application what-if scenarios. Extrapolations often refer to linear models, but that may not be the case. The expected statistic characteristics could also be step functions as determined by the nature of the architecture of the simulated IoT network. Additionally, the IoT database may be stored anywhere in the edge infrastructure, but is more efficiently maintained and used if stored on the gateway 310 or another aggregation device.

In these ways, the system 300 may enable optimal statistic size IoT deployments using an edge infrastructure with simulated end points (sensors), real and simulated aggregation devices (e.g., gateways 310, sensor hubs), the control UI 302, automation framework 306, and the IoT database. The IoT database can reside anywhere in the edge infrastructure. However, placing the IoT database on the gateway 310 results in faster lookups than if placed on other parts of the edge infrastructure. Moreover, in profiling and diagnostics, the IoT system 300, control UI 302, computing device 304, automation framework 306, endpoint simulators 308, gateways 310, and the cloud 312 may be real, virtual, or simulated.

Lastly, all of the devices depicted in the IoT system 300 of FIG. 3 can represent physical devices that are existing and real. However, any of the devices depicted in the IoT system 300 of FIG. 3 could be virtual or simulated. Indeed, the architectural elements disclosed herein such as IoT objects, network entities, servers, gateways or other nodes can be either real, virtual, or simulated. There may be an interchangeability of real, virtual, and simulated with respect to the depictions and representations of IoT system devices in the present specification and drawings. Moreover, the simulations for evaluating and detecting anomalies may run and operate in an environment where both live IoT systems and the simulation/emulation are running together to consider, for example, an expansion of an IoT system by testing the proposed architecture. Thus, embodiments may include a hybrid of live and simulated/emulated systems. This hybrid set-up may accommodate opportunity to test, for instance, system capacity and fault recovery scenarios. Moreover, the proposed expansion for an architecture may involve already-installed or existing devices outside of the IoT system to which the IoT system will incorporate or tie into, or can involve new IoT devices to be installed, and so on.

Figure 4:
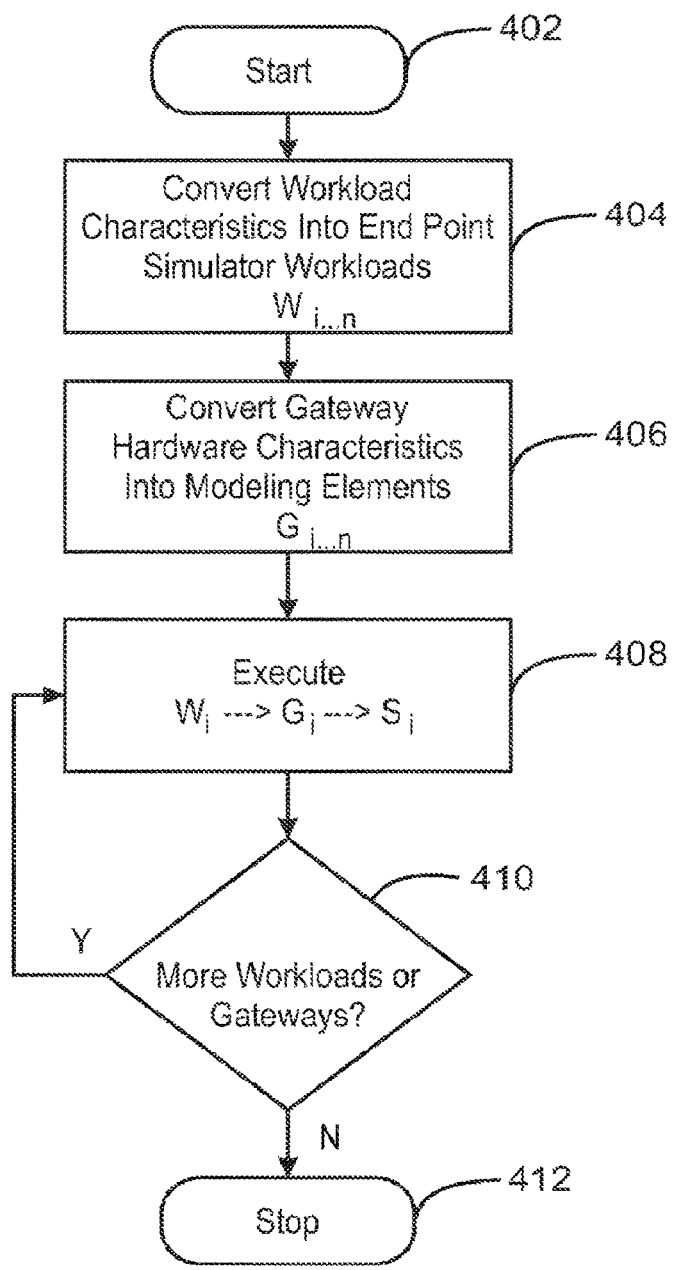
FIG. 4 is a block flow diagram of an example method for rapid prototyping in an IoT system.

FIG. 4 is an example method 400 for rapid prototyping in an IoT system. The method 400 begins at block 402, and is performed by the automation framework 306. At block 404, workload characteristics are converted into end point simulation workloads ($W_{i \ldots m}$). Each workload is a simulated representation of an actual workload as would be represented in a real world deployment scenario, the aggregated load which represents the workflow in its entirety. At block 406, gateway hardware characteristics are converted into modeling elements ($G_{i \ldots n}$). Each of the relevant components and their interactions are represented within the model thereby characterizing the behavior of the actual system during workflow executions. At block 408, the simulation is performed for each workload, and gateway modeling elements. The tracked statistics for the simulation are recorded in $S_i$. At block 410, it is determined if simulations have been run for all workloads and gateway configurations. If there are more, the next simulation is run at block 408. If there are no more, the method 400 stops at block 412. Moreover, in profiling and diagnostics, the IoT system, automation framework 306, endpoint simulation workloads, gateway modeling elements, and the like may be real, virtual, or simulated.

Figure 5:
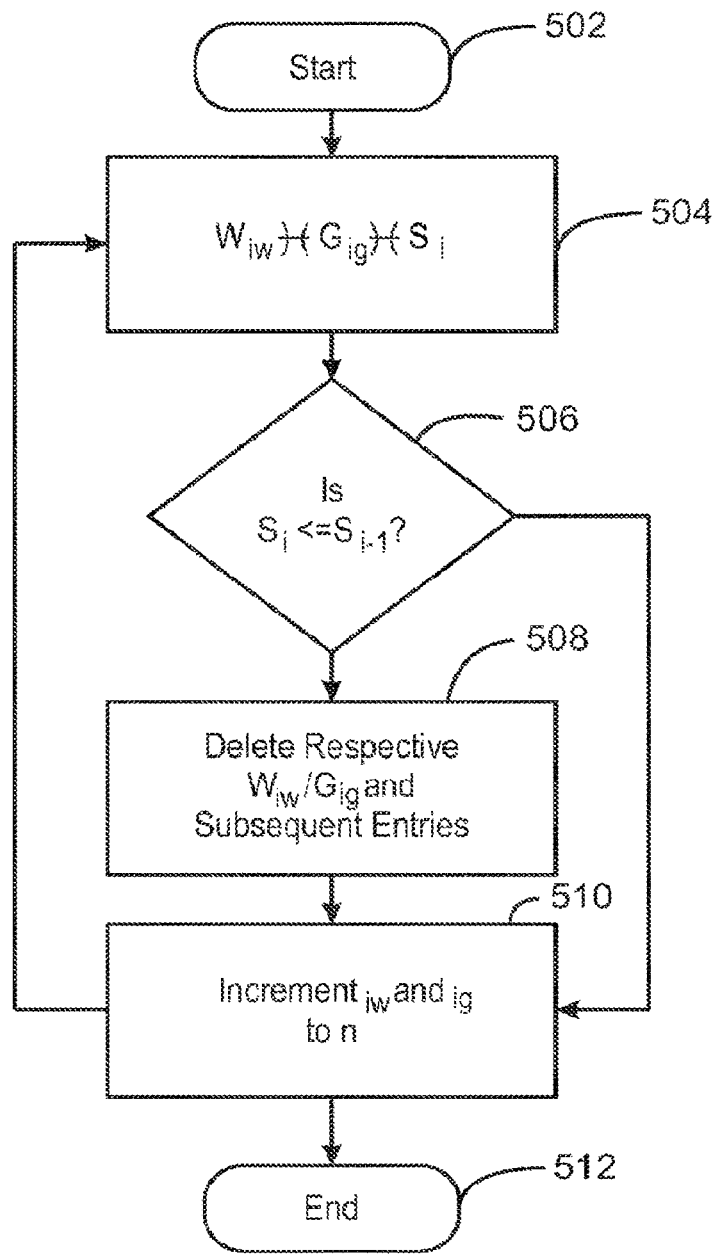
FIG. 5 is a block flow diagram of an example method for rapid prototyping in an IoT system.

FIG. 5 is an example method 500 for rapid prototyping in an IoT system. As stated previously, in profiling and diagnostics, the IoT system, automation framework, endpoint simulation workloads, gateway modeling elements, and the like may be real, virtual, or simulated. This may enable future proofing of rapid prototypes by varying workflows and gateway configurations, for example. However, some variations in the workflows and gateway configurations, do not create a great deal of variation in the statistics resulting from the simulation. In such cases, embodiments of the claimed subject matter may automatically eliminate similar workflows or gateway configurations from the executed simulations. The method 500 is performed for each simulation. Additionally, the method 500 begins at block 502, and is performed by the automation framework 306. At block 504, a simulation result is identified. At block, 506, it is determined whether the statistic, $S_i$ exceeds a specified threshold of variation. If so, the method 500 flows to block 510, then returns to block 504 to identify the next simulation. However, if the statistic, $S_i$ does not exceed the specified threshold of variation, at block 508, the respective workflow and gateway entries are removed from the potential simulations. The method 500 ends at block 512.

Workflow iterations as described in the illustration in FIG. 5, identify a workload consisting of workflows ($W_{iw}$, iw= 1 . . . n) and Gateway characteristics ($G_{ig}$, ig=1 . . . n). Observed statistic characteristics (Si) are measured against the previous runs. An absence of a variation, which may be a configurable parameter, would eliminate further increments in the workflow suite for the rest of the workflow sequence therefore eliminating a series of workloads from the simulations.

IoT applications are in their early years of development, which obscures the ability to perform accurate headroom analysis applications deployed in an IoT network. In current systems, when attempts are made to perform headroom analysis, they are based on linear extrapolations of current usage, which results in inaccurate representations of the workings of the target IoT network.

The target IoT network may also refer to the hardware architecture, such as the system deployment, the target gateway including CPU, memory, and storage specifications, and also to whether the gateway architecture is real, virtual, a hybrid of real and virtual, and so on. The target IoT network thus provides a background against which the characteristics of an observed IoT system are evaluated for a given gateway architecture. The "proposed solution" may be the contemplated or simulated observed characteristic(s), or potential response of a given architecture for a considered workload, and other features or representations, and so on.

Accordingly, future proofing IoT architectures is now made possible by performing headroom analysis of simulations of target workflows executed on modelled gateways, as described with respect to FIGS. 3-5. Target workflows may be approximations of the workload expected in future proofing scenarios. Embodiments of the claimed subject matter can be extended to contexts, such as processing utilization, memory, storage, and I/O's, within edge sensor modules, sensor hubs, and on data servers within the cloud. In embodiments, an IoT architecture characterization process evaluates a proposed architecture against the requirements of future workflows.

Future target workflows are simulated and extended on current and future simulated edge gateway models. Estimated metrics for the simulations are evaluated for optimal returns against pre-defined set of technical goals. The outlined embodiments describe the evaluation of the executed simulated future workflows on the modelled gateways and its lookup against quantified targeted technical solution characteristics by means of an integrated lookup table.

Furthermore, components such as the gateway and various sensors or servers, may be real, virtual, or simulated. Indeed, the representations described with respect to FIG. 5 may be real or simulated with respect to their depiction and in evaluation, including in any hybrid operation of the live real IoT components with simulated or emulated components.

IoT applications may be poised to integrate a growth of new and increasingly complex applications in the years to come. In order to accommodate this growth and prevent expensive overhauls of deployed IoT architectures, headroom analysis of future deployment scenarios is useful. Headroom analysis is a way to identify how much capacity is remaining for a specific resource before a bottleneck occurs. Accordingly, embodiments of the claimed subject matter iterate through numerous workflow permutations with the ability to determine the implications of potential future: changes to the workload, and upgrades to the gateway architecture of the IoT network. Such an embodiment enables complex what-if analysis capabilities that help identify potential future infrastructure bottlenecks and the impact on them from possible proposed upgrades, thereby providing insights that help determine the optimal target solution architecture that accommodates the workload and gateway architecture changes. In this way, embodiments of the claimed subject matter obviate potentially expensive overhauls of existing IoT network infrastructure.

Figure 6:
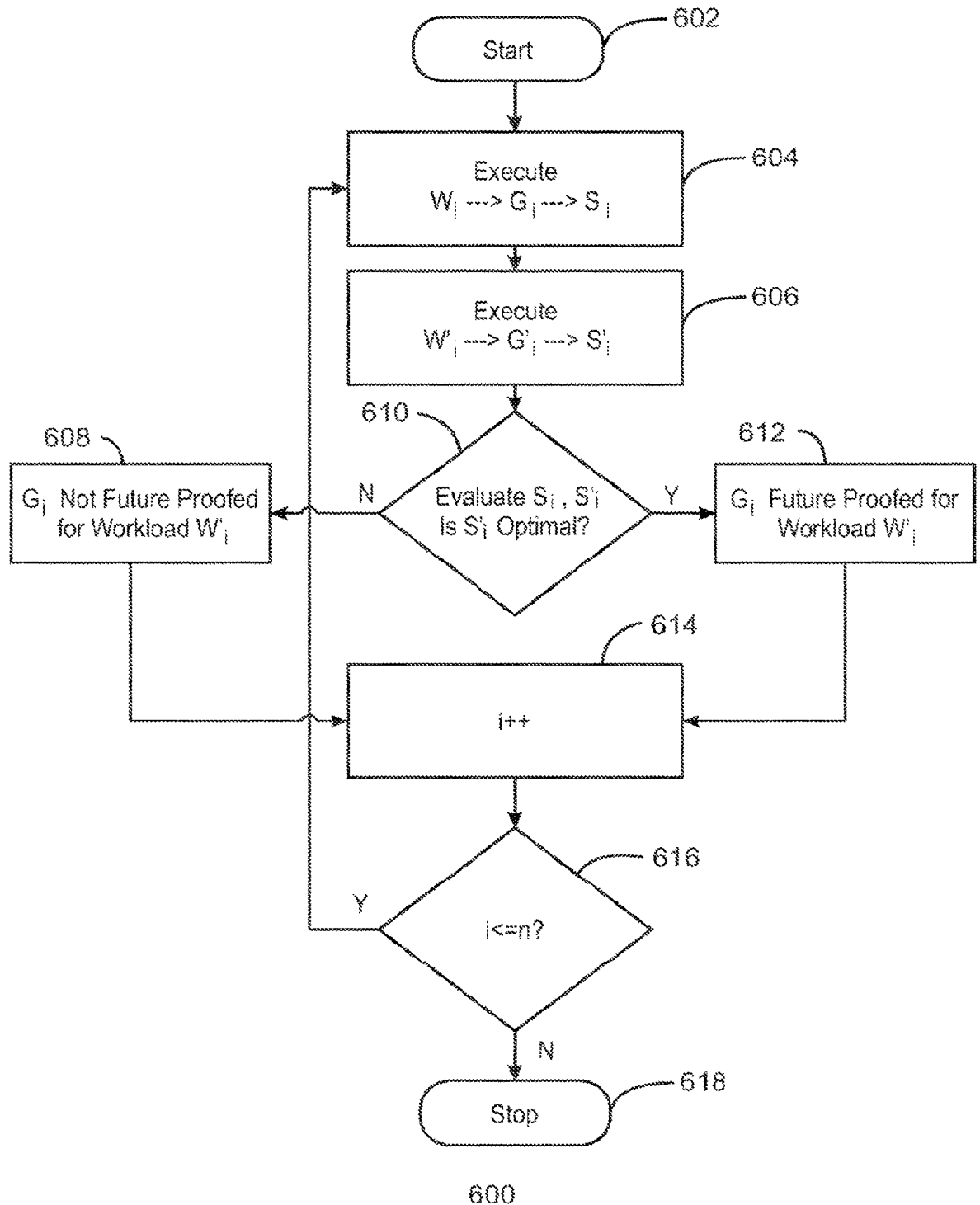
FIG. 6 is block flow diagram an example method for future proofing an IoT system.

FIG. 6 is an example method 600 for future proofing an IoT system. The method 600 determines a proposed future workload is compliant relative to the desired technical goals, and is performed by the automation framework 306. The method 600 begins at block 602. At block 604, the automation framework 306 helps define technical requirements based on target future workloads. At block 606, a simulation is executed for a given workflow and gateway configuration. At 608, 610, and 612, the automation framework evaluates the simulation, and determines the architecture and workflow characteristics against the modelled gateway architecture, and compares these architecture characteristics against the devices' desired technical architecture and workflow-level metrics by performing a lookup to the IoT database. Each workflow permutation is exercised in this manner using an iteration generator at block 614 until all target input workflows have been exhausted at 616, and flow stops at 618. All deviations outside of the target architecture parameters are flagged as non-compliant and marked for further evaluations. Furthermore, components such as the gateway and various sensors or servers, may be real, virtual, or simulated. Indeed, the representations described with respect to FIG. 5 may be real or simulated with respect to their depiction and in evaluation, including in any hybrid operation of the live real IoT components with simulated or emulated components.

Figure 7:
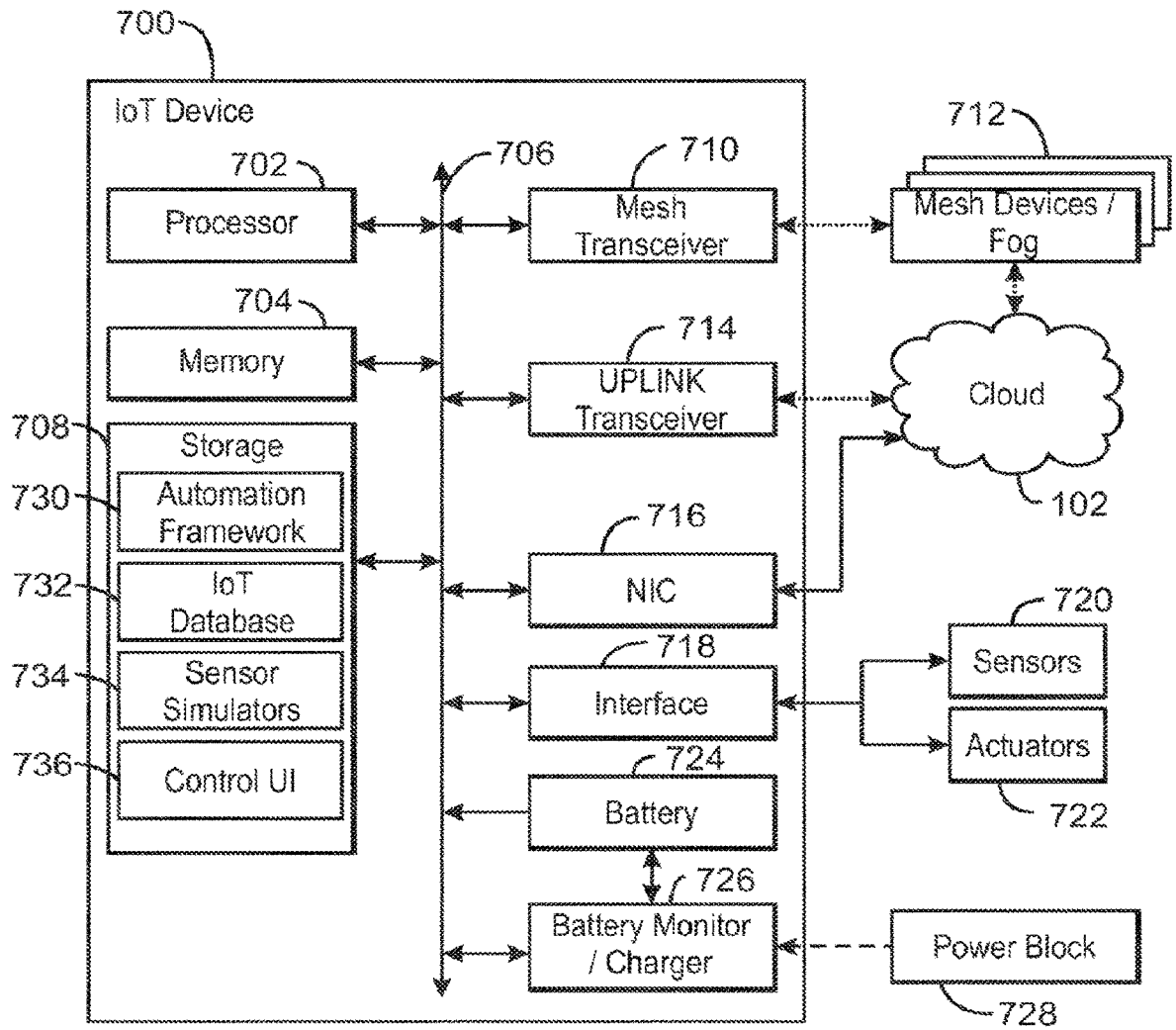
FIG. 7 is diagram an example IoT device for future proofing and rapid prototyping.

FIG. 7 is an example IoT system 700 for future proofing and rapid prototyping. The IoT system 700 may include any combinations of the components shown in the example. The components may be implemented as ICs, portions thereof, discrete electronic devices, or other modules, logic, hardware, software, firmware, or a combination thereof adapted in the IoT system 700, or as components otherwise incorporated within a chassis of a larger system. The block diagram of FIG. 7 is intended to show a high level view of components of the IoT system 700. However, some of the components shown may be omitted, additional components may be present, and different arrangement of the components shown may occur in other implementations.

The IoT system 700 may include a processor 702, which may be a microprocessor, a multi-core processor, a multi-threaded processor, an ultra-low voltage processor, an embedded processor, or other known processing element. The processor 702 may be a part of a system on a chip (SoC)

in which the processor 702 and other components are formed into a single integrated circuit, or a single package, such as the Edison™ or Galileo™ SoC boards from Intel. As an example, the processor 702 may include an Intel® Architecture Core™ based processor, such as a Quark™, an Atom™, an i3, an i5, an i7, or an MCU-class processor, or another such processor available from Intel® Corporation, Santa Clara, Calif. However, any number other processors may be used, such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters. The processors may include units such as an A5-A9 processor from Apple® Inc., a Snapdragon™ processor from Qualcomm® Technologies, Inc., or an OMAP™ processor from Texas Instruments, Inc.

The processor 702 may communicate with a system memory 704 over a bus 706. Any number of memory devices may be used to provide for a given amount of system memory. As examples, the memory can be random access memory (RAM) in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard, such as LPDDR3 or LPDDR4 that will offer extensions to LPDDR2 to increase bandwidth. In various implementations the individual memory devices may be of any number of different package types such as single die package (SDP), dual die package (DDP) or quad die package (Q17P). These devices, in some embodiments, may be directly soldered onto a motherboard to provide a lower profile statistic, while in other embodiments the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs. For example, a memory may be sized between 2 GB and 16 GB, and may be configured as a DDR3LM package or an LPDDR2 or LPDDR3 memory, which is soldered onto a motherboard via a ball grid array (BGA).

To provide for persistent storage of information such as data, applications, operating systems and so forth, a mass storage 708 may also couple to the processor 702 via the bus 706. To enable a thinner and lighter system design the mass storage 708 may be implemented via a solid state disk drive (SSDD). Other devices that may be used for the mass storage 708 include flash memory cards, such as SD cards, microSD cards, xD picture cards, and the like, and USB flash drives. In low power implementations, the mass storage 708 may be on-die memory or registers associated with the processor 702. However, in some examples, the mass storage 708 may be implemented using a micro hard disk drive (HDD). Further, any number of new technologies may be used for the mass storage 708 in addition to, or instead of, the technologies described, such resistance change memories, phase change memories, holographic memories, or chemical memories, among others. For example, the IoT system 700 may incorporate the 3D XPOINT memories from Intel® and Micron®.

The components may communicate over the bus 706. The bus 706 may include any number of technologies, including industry standard architecture (ISA), extended ISA (EISA), peripheral component interconnect (PCI), peripheral component interconnect extended (PCIx), PCI express (PCIe), or any number of other technologies. The bus 706 may be a proprietary bus, for example, used in a SoC based system. Other bus systems may be included, such as an I2C interface, an SPI interface, point to point interfaces, and a power bus, among others.

The bus 706 may couple the processor 702 to a mesh transceiver 710, for communications with other mesh devices 712. The mesh transceiver 710 may use any number of frequencies and protocols, such as 2.4 gigahertz (GHz) transmissions under the IEEE 802.15.4 standard, using the Bluetooth® low energy (BLE) standard, as defined by the Bluetooth® Special Interest Group, or the ZigBee® standard, among others. Any number of radios, configured for a particular wireless communication protocol, may be used for the connections to the mesh devices 712. For example, a WLAN unit may be used to implement Wi-Fi™ communications in accordance with the Institute of Electrical and Electronics Engineers (IEEE) 802.11 standard. In addition, wireless wide area communications, e.g., according to a cellular or other wireless wide area protocol, can occur via a WWAN unit.

The mesh transceiver 710 may communicate using multiple standards or radios for communications at different range. For example, the IoT system 700 may communicate with close devices, e.g., within about 10 meters, using a local transceiver based on BLE, or another low power radio, to save power. More distant mesh devices 712, e.g., within about 10 meters, may be reached over ZigBee or other intermediate power radios. Both communications techniques may take place over a single radio at different power levels, or may take place over separate transceivers, for example, a local transceiver using BLE and a separate mesh transceiver using ZigBee. The mesh transceiver 710 may be incorporated into an MCU as an address directly accessible by the chip, such as in the Curie® units available from Intel.

An uplink transceiver 714 may be included to communicate with devices in the cloud 102. The uplink transceiver 714 may be LPWA transceiver that follows the IEEE 802.15.4, or IEEE 802.15.4g standards, among others. The IoT system 700 may communicate over a wide area using LoRaWAN™ (Long Range Wide Area Network) developed by Semtech and the LoRa Alliance. The techniques described herein are not limited to these technologies, but may be used with any number of other cloud transceivers that implement long range, low bandwidth communications, such as Sigfox, and other technologies. Further, other communications techniques, such as time-slotted channel hopping, described in IEEE 802.15.4e may be used.

Any number of other radio communications and protocols may be used in addition to the systems mentioned for the mesh transceiver 710 and uplink transceiver 714, as described herein. For example, the radio transceivers 710 and 712 may include an LTE or other cellular transceiver that uses spread spectrum (SPA/SAS) communications for implementing high speed communications, such as for video transfers. Further, and number of other protocols may be used, such as Wi-Fi networks for medium speed communications, such as still pictures, sensor readings, and provision of network communications.

The radio transceivers 710 and 712 may include radios that are compatible with any number of 3GPP (Third Generation Partnership Project) specifications, notably Long Term Evolution (LTE), Long Term Evolution-Advanced (LTE-A), and Long Term Evolution-Advanced Pro (LTE-A Pro). It can be noted that radios compatible with any number of other fixed, mobile, or satellite communication technologies and standards may be selected. These may include, for example, any Cellular Wide Area radio communication technology, which may include e.g. a 5th Generation (5G) communication systems, a Global System for Mobile Communications (GSM) radio communication technology, a General Packet Radio Service (GPRS) radio communication technology, or an Enhanced Data Rates for GSM Evolution (EDGE) radio communication technology. Other Third Generation Partnership Project (3GPP) radio communication technology that may be used includes UMTS (Universal Mobile Telecommunications System), FOMA (Freedom of Multimedia Access), 3GPP LTE (Long Term Evolution), 3GPP LTE Advanced (Long Term Evolution Advanced), 3GPP LTE Advanced Pro (Long Term Evolution Advanced Pro)), CDMA2000 (Code division multiple access 2000), CDPD (Cellular Digital Packet Data), Mobitex, 3G (Third Generation), CSD (Circuit Switched Data), HSCSD (High-Speed Circuit-Switched Data), UMTS (3G) (Universal Mobile Telecommunications System (Third Generation)), W-CDMA (UMTS) (Wideband Code Division Multiple Access (Universal Mobile Telecommunications System)), HSPA (High Speed Packet Access), HSDPA (High-Speed Downlink Packet Access), HSUPA (High-Speed Uplink Packet Access), HSPA+ (High Speed Packet Access Plus), UMTS-TDD (Universal Mobile Telecommunications System—Time-Division Duplex), TD-CDMA (Time Division—Code Division Multiple Access), TD-SCDMA (Time Division—Synchronous Code Division Multiple Access), 3GPP Rel. 8 (Pre-4G) (3rd Generation Partnership Project Release 8 (Pre-4th Generation)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP LTE Extra, LTE Licensed-Assisted Access (LAA), UTRA (UMTS Terrestrial Radio Access), E-UTRA (Evolved UMTS Terrestrial Radio Access), LTE Advanced (4G) (Long Term Evolution Advanced (4th Generation)), cdmaOne (2G), CDMA2000 (3G) (Code division multiple access 2000 (Third generation)), EV-DO (Evolution-Data Optimized or Evolution-Data Only), AMPS (1G) (Advanced Mobile Phone System (1st Generation)), TACS/ETACS (Total Access Communication System/Extended Total Access Communication System), 2-AMPS (2G) (Digital AMPS (2nd Generation)), PTT (Push-to-talk), MTS (Mobile Telephone System), IMTS (Improved Mobile Telephone System), AMTS (Advanced Mobile Telephone System), OLT (Norwegian for Offentlig Landmobil Telefoni, Public Land Mobile Telephony), MTD (Swedish abbreviation for Mobiltelefonisystem 2, or Mobile telephony system 2), Autotel/PALM (Public Automated Land Mobile), ARP (Finnish for Autoradiopuhelin, "car radio phone"), NMT (Nordic Mobile Telephony), Hicap (High capacity version of NTT (Nippon Telegraph and Telephone)), CDPD (Cellular Digital Packet Data), Mobitex, DataTAC, iDEN (Integrated Digital Enhanced Network), PDC (Personal Digital Cellular), CSD (Circuit Switched Data), PHS (Personal Handyphone System), WiDEN (Wideband Integrated Digital Enhanced Network), iBurst, Unlicensed Mobile Access (UMA, also referred to as also referred to as 3GPP Generic Access Network, or GAN standard)), Wireless Gigabit Alliance (WiGig) standard, mmWave standards in general (wireless systems operating at 10-90 GHz and above such as WiGig, IEEE 802.11ad, IEEE 802.11ay, and the like. In addition to the standards listed above, any number of satellite uplink technologies may be used for the uplink transceiver 714, including, for example, radios compliant with standards issued by the ITU (International Telecommunication Union), or the ETSI (European Telecommunications Standards Institute), among others. The examples provided herein are thus understood as being applicable to various other communication technologies, both existing and not yet formulated.

A network interface controller (NIC) 716 may be included to provide a wired communication to the cloud 102. The wired communication may provide an Ethernet connection, or may be based on other types of networks, such as Controller Area Network (CAN), Local Interconnect Network (LIN), DeviceNet, ControlNet, Data Highway+, PROFIBUS, or PROFINET, among many others. An additional NIC 716 may be included to allow connect to a second network, for example, a NIC 716 providing communications to the cloud over Ethernet, and a second NIC 716 providing communications to other devices over another type of network.

The bus 706 may couple the processor 702 to an interface 718 that is used to connect external devices. The external devices may include sensors 720, such as accelerometers, level sensors, flow sensors, temperature sensors, pressure sensors, barometric pressure sensors, and the like. The interface 718 may be used to connect the IoT system 700 to actuators 722, such as power switches, valve actuators, an audible sound generator, a visual warning device, and the like.

While not shown, various input/output (I/O) devices may be present within, or connected to, the IoT system 700. For example, a display may be included to show information, such as sensor readings or actuator position. An input device, such as a touch screen or keypad may be included to accept input.

A battery 724 may power the IoT system 700, although in examples in which the IoT system 700 is mounted in a fixed location, it may have a power supply coupled to an electrical grid. The battery 724 may be a lithium ion battery, a metal-air battery, such as a zinc-air battery, an aluminum-air battery, a lithium-air battery, and the like.

A battery monitor/charger 726 may be included in the IoT system 700 to track the state of charge (SoCh) of the battery 720. The battery monitor/charger 726 may be used to monitor other parameters of the battery 724 to provide failure predictions, such as the state of health (SoH) and the state of function (SoF) of the battery 724. The battery monitor/charger 726 may include a battery monitoring integrated circuit, such as an LTC4020 or an LTC2990 from Linear Technologies, an ADT7488A from ON Semiconductor of Phoenix Ariz., or an IC from the UCD90xxx family from Texas Instruments of Dallas, Tex. The battery monitor/charger 726 may communicate the information on the battery 724 to the processor 702 over the bus 706. The battery monitor/charger 726 may also include an analog-to-digital (ADC) convertor that allows the processor 702 to directly monitor the voltage of the battery 726 or the current flow from the battery 724. The battery parameters may be used to determine actions that the IoT system 700 may perform, such as transmission frequency, mesh network operation, sensing frequency, and the like.

A power block 728, or other power supply coupled to a grid, may be coupled with the battery monitor/charger 726 to charge the battery 724. In some examples, the power block 728 may be replaced with a wireless power receiver to obtain the power wirelessly, for example, through a loop antenna in the IoT system 700. A wireless battery charging circuit, such as an LTC4020 chip from Linear Technologies of Milpitas, Calif., among others, may be included in the battery monitor/charger 726. The specific charging circuits chosen depend on the size of the battery 724, and thus, the current required. The charging may be performed using the Airfuel standard promulgated by the Airfuel Alliance, the Qi wireless charging standard promulgated by the Wireless Power Consortium, the Rezence charging standard, promulgated by the Alliance for Wireless Power, among others.

The mass storage 708 may include a number of modules to implement the rapid IoT prototyping functions described herein. Although shown as code blocks in the mass storage 708, it may be understood that any of the modules may be replaced with hardwired circuits, for example, built into an application specific integrated circuit (ASIC). The mass storage 708 may include an automation framework 730, an IoT database 732, end point sensor simulators 734, and a control user interface 736. The automation framework 730 runs the simulation by passing simulated events generated by the end point sensor simulators 734 to a simulated IoT network. The automation framework 734 populates a tuple in the IoT database 732 with a characterization of the simulation. The control user interface 736 is used to define the architectural specifications of simulated IoT network, and to define the simulated workload to be processed in the simulation.

Additionally or alternatively, the mass storage 708 may include a number of modules to implement IoT future proofing functions described herein. The mass storage 708 may include an automation framework 730, an IoT database 732, end point sensor simulators 734, and a control user interface 736. The automation framework 730 runs the simulation by passing simulated events generated by the end point sensor simulators 734 to a simulated IoT network. The automation framework 734 populates a tuple in the IoT database 732 with a characterization of the simulation. The control user interface 736 may be used to define the architectural specifications of simulated IoT network, and to define the simulated workload to be processed in the simulation.

Furthermore, components such as the gateway and various sensors or servers, may be real, virtual, or simulated. Indeed, the representations described with respect to FIG. 7 may be real or simulated with respect to their depiction and in evaluation, including in any hybrid operation of the live real IoT components with simulated or emulated components.

Figure 8:
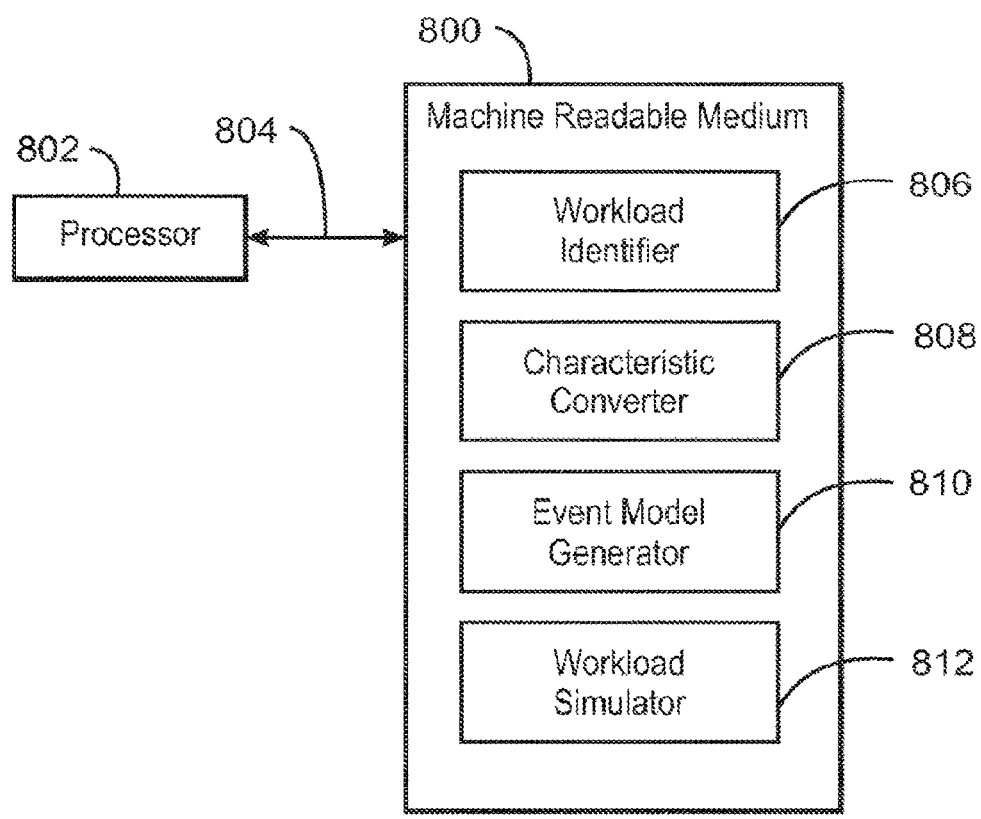
FIG. 8 is a block diagram of a non-transitory, machine readable medium including code to direct a processor to perform rapid prototyping in an IoT system.

FIG. 8 is a block diagram of a non-transitory, machine readable medium 800 including code to direct a processor to perform rapid prototyping in an IoT system. The processor 802 may access the non-transitory, machine readable medium 800 over a bus 804. The processor 802 and bus 804 may be as described with respect to FIG. 7. The non-transitory, machine readable medium 800 may include devices described for a mass storage, such as optical disks, thumb drives, or any number of other hardware devices, also as described with respect to FIG. 7. The non-transitory, machine readable medium 800 may include code 806 to direct the processor 802 to identify a real-world workload, code 808 to convert characteristics of the real-world workload to endpoint simulator workloads, code 810 to generate an event model, and code 812 to simulate processing the endpoint simulator workloads. Furthermore, components such as the gateway and various sensors or servers, may be real, virtual, or simulated. Indeed, the representations described with respect to FIG. 5 may be real or simulated with respect to their depiction and in evaluation, including in any hybrid operation of the live real IoT components with simulated or emulated components.

Figure 9:
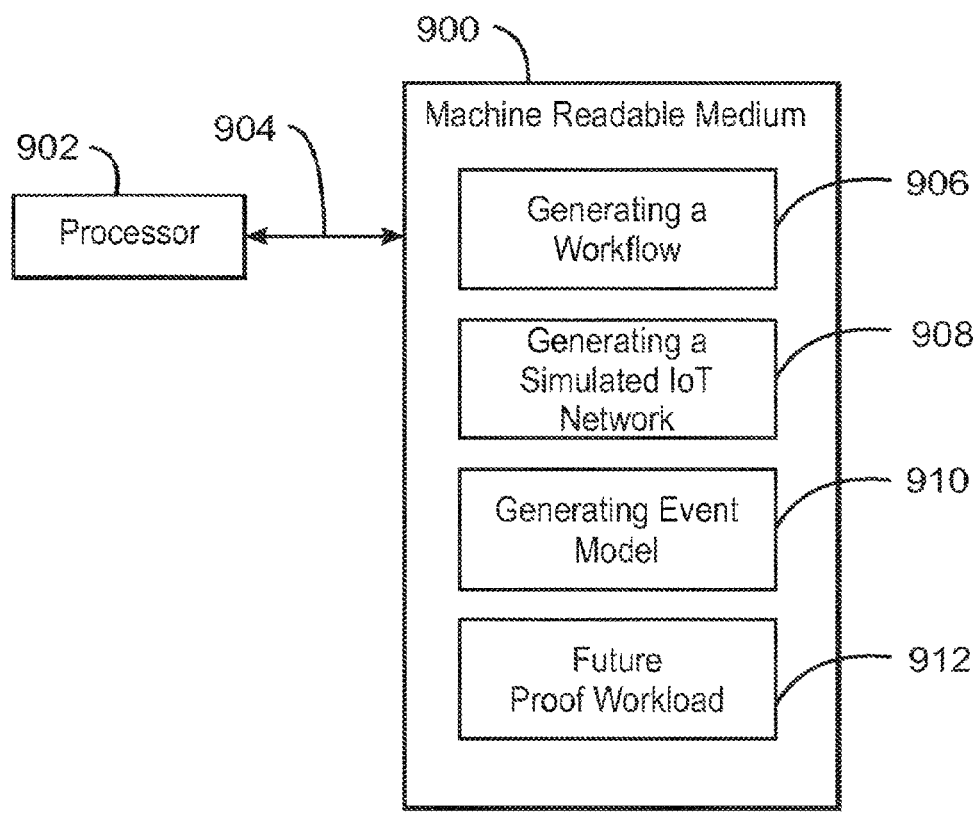
FIG. 9 is a block diagram of a non-transitory, machine readable medium including code to direct a processor to future proof the IoT system.

FIG. 9 is a non-transitory, machine readable medium 900 including code to direct a processor 902 to future proof the IoT system. The processor 902 may access the non-transitory, machine readable medium 900 over a bus 904. The processor 902 and bus 904 may be as described with respect to FIG. 7. The non-transitory, machine readable medium 900 may include devices described for the mass storage 708 of FIG. 7 or may include optical disks, thumb drives, or any number of other hardware devices.

The non-transitory, machine readable medium 900 may include code 906 to direct the processor 902 to generate a workflow as described herein. The medium 900 may also include code 908 to generate a simulated IoT network, code 910 to generate an event model, and code 912 to future proof the generated workflow. Furthermore, components such as the gateway and various sensors or servers, may be real, virtual, or simulated. Indeed, the representations described with respect to FIG. 9 may be real or simulated with respect to their depiction and in evaluation, including in any hybrid operation of the live real IoT components with simulated or emulated components.

Some examples are described below.

Examples are given. Example 1 includes a method of determining headroom for applications includes generating a workflow by modifying a real-world workflow to incorporate a future expectation for the workload, generating a simulated Internet of things (IoT) network for future proofing the workload and a configuration for a simulated gateway of the simulated IoT network, generating an event model for an IoT network based on the future proofing workflow, and future proofing the workload and the configuration by simulating an execution of the workflow on the simulated IoT network.

Example 2 includes the method of example 1, wherein future proofing the workload and the configuration includes generating a model of future applications, and simulating an execution of the workflow on the simulated IoT network using the model of future applications.

Example 3 includes the method of examples 1 or 2, wherein the future expectation includes future target workflows.

Example 4 includes the method of examples 1 or 2, including determining an implication of a future workflow by analyzing statistic characteristics of the simulated execution.

Example 5 includes the method of example 1, including predicting non-linear solution characteristics triggered by varying input parameters.

Example 6 includes a system for future proofing IoT networks including a control user interface to define a simulated Internet of things (IoT) network associated with a real IoT network, a plurality of sensor simulators to generate events for a future proof workload, and an automation framework to future proof the real IoT network by simulating processing of the future proof workload in the simulated IoT network.

Example 7 includes the system of example 6, wherein future proofing the workload and the configuration includes generating a model of future applications, and simulating an execution of the workflow on the simulated IoT network using the model of future applications.

Example 8 includes the system of examples 6 or 7, wherein the future expectation includes future target workflows.

Example 9 includes the system of examples 6 or 7, wherein the automation framework is to determine an implication of a future workflow by analyzing statistic characteristics of the simulated execution.

Example 10 includes the system of examples 6 or 7, wherein the automation framework is to predict non-linear solution characteristics triggered by varying input parameters.

Example 11 includes a tangible, non-transitory, computer-readable medium including code executable by a processor to direct the processor to generate a workflow by modifying a real-world workflow to incorporate a future expectation for the workload, generate a simulated Internet of things (IoT) network for future proofing the workload and a configuration for a simulated gateway of the simulated IoT network, generate an event model for an IoT network based on the future proofing workflow, and future proof the workload and the configuration by simulating an execution of the workflow on the simulated IoT network.

Example 12 includes the medium of example 11. In some examples, the workload and the configuration are future proofed by generating a model of future applications, and simulating an execution of the workflow on the simulated IoT network using the model of future applications.

Example 13 includes the medium of examples 11 or 12, wherein the future expectation includes future target workflows.

Example 14 includes the medium of examples 11 or 12, including code executable by the processor to determine an implication of a future workflow by analyzing statistic characteristics of the simulated execution.

Example 15 includes the medium of examples 11 or 12, including code executable by the processor to predict non-linear solution characteristics triggered by varying input parameters.

Example 16 includes an apparatus for representing events that occur in a real world deployment includes means for identifying a real-world workload including a plurality of the events, means for converting a plurality of characteristics of the real-world workload into a plurality of endpoint simulator workloads, means for converting a plurality of gateway hardware characteristics into a plurality of modeling elements for a plurality of simulated Internet of things (IoT) networks, means for performing a simulation for each of the endpoint simulator workloads on each of the simulated IoT networks, means for collecting statistics about the performed simulation of the simulated IoT networks for the endpoint simulator workloads, means for generating a workflow by modifying the real-world workload to incorporate a future expectation for the real-world workload, means for generating a simulated IoT network for future proofing the workload and a configuration for a simulated gateway of the simulated IoT network, means for generating an event model for the simulated IoT network based on the future proofing workflow, and means for future proofing the workload and the configuration by simulating an execution of the workflow on the simulated IoT network.

Example 17 includes the apparatus of example 16 including means for characterizing a performance of the simulated IoT networks for the endpoint simulator workloads.

Example 18 includes the apparatus of examples 16 or 17, including means for modifying a sensed value of an event in the endpoint simulator workload via a user interface.

Example 19 includes the apparatus of examples 16 or 17, including means for generating events that trigger multiple simultaneous triggers.

Example 20 includes the apparatus of examples 16 or 17, including means for deterministically simulating multiple triggers.

Example 21 includes the apparatus of examples 16 or 17, including means for deterministically evaluating statistics from simultaneous variations of multiple triggers.

Example 22 includes the apparatus of example 16, including means for determining the statistics for the simulation. In some examples, the simulation is performed in short durations.

Example 23 includes the apparatus of example 16, including means for adaptively eliminating workloads and gateway metrics that do not have an impact on the statistics.

Example 24 includes the apparatus of example 16, including means for performing the simulations in parallel what-if analysis runs.

Example 25 includes the apparatus of example 24, including means for dynamically coordinating results from executed modules to determine execute sequences.

Example 26 includes a method of determining headroom for applications includes generating a workflow by modifying a real-world workflow to incorporate a future expectation for the workload, generating a simulated Internet of things (IoT) network for future proofing the workload and a configuration for a simulated gateway of the simulated IoT network, generating an event model for an IoT network based on the future proofing workflow, and future proofing the workload and the configuration by simulating an execution of the workflow on the simulated IoT network.

Example 27 includes the method of example 26. In some examples, future proofing the workload and the configuration includes generating a model of future applications, and simulating an execution of the workflow on the simulated IoT network using the model of future applications.

Example 28 includes the method of example 26. In some examples, the future expectation includes future target workflows.

Example 29 includes the method of example 26, including determining an implication of a future workflow by analyzing statistic characteristics of the simulated execution.

Example 30 includes the method of example 26, including predicting non-linear solution characteristics triggered by varying input parameters.

Example 31 includes a system for future proofing IoT networks including a control user interface to define a simulated Internet of things (IoT) network associated with a real IoT network, a plurality of sensor simulators to generate events for a future proof workload, and an automation framework to future proof the real IoT network by simulating processing of the future proof workload in the simulated IoT network.

Example 32 includes the system of example 31. In some examples, future proofing the workload and the configuration includes generating a model of future applications, and simulating an execution of the workflow on the simulated IoT network using the model of future applications.

Example 33 includes the system of example 31. In some examples, the future expectation includes future target workflows.

Example 34 includes the system of example 31. In some examples, the automation framework is to determine an implication of a future workflow by analyzing statistic characteristics of the simulated execution.

Example 35 includes the system of example 31. In some examples, the automation framework is to predict non-linear solution characteristics triggered by varying input parameters.

36 A tangible, non-transitory, computer-readable medium including code executable by a processor to direct the processor to generate a workflow by modifying a real-world workflow to incorporate a future expectation for the workload, generate a simulated Internet of things (IoT) network for future proofing the workload and a configuration for a simulated gateway of the simulated IoT network, generate an event model for an IoT network based on the future proofing workflow, and future proof the workload and the configuration by simulating an execution of the workflow on the simulated IoT network.

Example 37 includes the medium of example 36. In some examples, the workload and the configuration are future proofed by generating a model of future applications, and simulating an execution of the workflow on the simulated IoT network using the model of future applications.

Example 38 includes the medium of example 36. In some examples, the future expectation includes future target workflows.

Example 39 includes the medium of example 36, including code executable by the processor to determine an implication of a future workflow by analyzing statistic characteristics of the simulated execution.

Example 40 includes the medium of example 36, including code executable by the processor to predict non-linear solution characteristics triggered by varying input parameters.

Example 41 includes a method of representing events that occur in a real world deployment includes identifying a real-world workload including a plurality of the events, converting a plurality of characteristics of the real-world workload into a plurality of endpoint simulator workloads, converting a plurality of gateway hardware characteristics into a plurality of modeling elements for a plurality of simulated Internet of things (IoT) networks, performing a simulation for each of the endpoint simulator workloads on each of the simulated IoT networks, collecting statistics about the performed simulation of the simulated IoT networks for the endpoint simulator workloads, generating a workflow by modifying the real-world workload to incorporate a future expectation for the real-world workload, generating a simulated IoT network for future proofing the workload and a configuration for a simulated gateway of the simulated IoT network, generating an event model for the simulated IoT network based on the future proofing workflow, and future proofing the workload and the configuration by simulating an execution of the workflow on the simulated IoT network.

Example 42 includes the method of example 41, including characterizing a performance of the simulated IoT networks for the endpoint simulator workloads.

Example 43 includes the method of example 42, including modifying a sensed value of an event in the endpoint simulator workload via a user interface.

Example 44 includes the method of example 41, further including generating events that trigger multiple simultaneous triggers.

Example 45 includes the method of example 41, further including deterministically simulating multiple triggers.

Example 46 includes the method of example 41, including deterministically evaluating statistics from simultaneous variations of multiple triggers.

Example 47 includes the method of example 41, including determining the statistics for the simulation. In some examples, the simulation is performed in short durations.

Example 48 includes the method of example 41, including adaptively eliminating workloads and gateway metrics that do not have an impact on the statistics.

Example 49 includes the method of example 41, including performing the simulations in parallel what-if analysis runs.

Example 50 includes the method of example 49, including dynamically coordinating results from executed modules to determine execute sequences.

Example 51 includes a method of determining headroom for applications includes generating a workflow by modifying a real-world workflow to incorporate a future expectation for the workload, generating a simulated Internet of things (IoT) network for future proofing the workload and a configuration for a simulated gateway of the simulated IoT network, generating an event model for an IoT network based on the future proofing workflow, and future proofing the workload and the configuration by simulating an execution of the workflow on the simulated IoT network.

Example 52 includes the method of example 51. In some examples, future proofing the workload and the configuration includes generating a model of future applications, and simulating an execution of the workflow on the simulated IoT network using the model of future applications.

Example 53 includes the method of examples 51 or 52, wherein the future expectation includes future target workflows.

Example 54 includes the method of examples 51 or 52, including determining an implication of a future workflow by analyzing statistic characteristics of the simulated execution.

Example 55 includes the method of examples 51 or 52, including predicting non-linear solution characteristics triggered by varying input parameters.

Example 56 includes a system for future proofing IoT networks including a control user interface to define a simulated Internet of things (IoT) network associated with a real IoT network, a plurality of sensor simulators to generate events for a future proof workload, and an automation framework to future proof the real IoT network by simulating processing of the future proof workload in the simulated IoT network.

Example 57 includes the system of example 56. In some examples, future proofing the workload and the configuration includes generating a model of future applications, and simulating an execution of the workflow on the simulated IoT network using the model of future applications.

Example 58 includes the system of examples 56 or 57, wherein the future expectation includes future target workflows.

Example 59 includes the system of examples 56 or 57, wherein the automation framework is to determine an implication of a future workflow by analyzing statistic characteristics of the simulated execution.

Example 60 includes the system of examples 56 or 57, wherein the automation framework is to predict non-linear solution characteristics triggered by varying input parameters.

Example 61 includes a system for representing events that occur in a real world deployment includes a control user interface to define a simulated Internet of things (IoT) network associated with a real IoT network, a plurality of sensor simulators to generate events for a future proof workload, and an automation framework to future proof the real IoT network by simulating processing of the future proof workload in the simulated IoT network, wherein the automation framework identifies a real-world workload including a plurality of the events, converts a plurality of characteristics of the real-world workload into a plurality of endpoint simulator workloads, converts a plurality of gateway hardware characteristics into a plurality of modeling elements for a plurality of simulated Internet of things (IoT) networks, performs a simulation for each of the endpoint simulator workloads on each of the simulated IoT networks, collects statistics about the performed simulation of the simulated IoT networks for the endpoint simulator workloads, generates a workflow by modifying the real-world workload to incorporate a future expectation for the real-world workload, generates a simulated IoT network for future proofs the workload and a configuration for a simulated gateway of the simulated IoT network, generates an event model for the simulated IoT network based on the future proofs workflow, and future proofs the workload and the configuration by simulating an execution of the workflow on the simulated IoT network.

Example 62 includes the system of example 61. In some examples, the automation framework characterizes a performance of the simulated IoT networks for the endpoint simulator workloads.

Example 63 includes the system of examples 61 or 62, wherein the automation framework modifies a sensed value of an event in the endpoint simulator workload via a user interface.

Example 64 includes the system of examples 61 or 62, wherein the automation framework generates events that trigger multiple simultaneous triggers.

Example 65 includes the system of examples 61 or 62, wherein the automation framework deterministically simulates multiple triggers.

Example 66 includes a method of representing events that occur in a real world deployment includes identifying a real-world workload including a plurality of the events, converting a plurality of characteristics of the real-world workload into a plurality of endpoint simulator workloads, converting a plurality of gateway hardware characteristics into a plurality of modeling elements for a plurality of simulated Internet of things (IoT) networks, performing a simulation for each of the endpoint simulator workloads on each of the simulated IoT networks, collecting statistics about the performed simulation of the simulated IoT networks for the endpoint simulator workloads, generating a workflow by modifying the real-world workload to incorporate a future expectation for the real-world workload, generating a simulated IoT network for future proofing the workload and a configuration for a simulated gateway of the simulated IoT network, generating an event model for the simulated IoT network based on the future proofing workflow, and future proofing the workload and the configuration by simulating an execution of the workflow on the simulated IoT network.

Example 67 includes the method of example 66 including characterizing a performance of the simulated IoT networks for the endpoint simulator workloads.

Example 68 includes the method of examples 66 or 67, including modifying a sensed value of an event in the endpoint simulator workload via a user interface.

Example 69 includes the method of examples 66 or 67, further including generating events that trigger multiple simultaneous triggers.

Example 70 includes the method of examples 66 or 67, further including deterministically simulating multiple triggers.

Example 71 includes the method of example 66, including deterministically evaluating statistics from simultaneous variations of multiple triggers.

Example 72 includes the method of example 66, including determining the statistics for the simulation. In some examples, the simulation is performed in short durations.

Example 73 includes the method of example 66, including adaptively eliminating workloads and gateway metrics that do not have an impact on the statistics.

Example 74 includes the method of example 66, including performing the simulations in parallel what-if analysis runs.

Example 75 includes the method of example 74, including dynamically coordinating results from executed modules to determine execute sequences.

Example 76 includes a method of determining headroom for applications includes generating a workflow by modifying a real-world workflow to incorporate a future expectation for the workload, generating a simulated Internet of things (IoT) network for future proofing the workload and a configuration for a simulated gateway of the simulated IoT network, generating an event model for an IoT network based on the future proofing workflow, and future proofing the workload and the configuration by simulating an execution of the workflow on the simulated IoT network.

Example 77 includes the method of example 76. In some examples, future proofing the workload and the configuration includes generating a model of future applications, and simulating an execution of the workflow on the simulated IoT network using the model of future applications.

Example 78 includes the method of examples 76 or 77, wherein the future expectation includes future target workflows.

Example 79 includes the method of examples 76 through 78, including determining an implication of a future workflow by analyzing statistic characteristics of the simulated execution.

Example 80 includes the method of example 76, including predicting non-linear solution characteristics triggered by varying input parameters.

Example 81 includes a system for future proofing IoT networks including a control user interface to define a simulated Internet of things (IoT) network associated with a real IoT network, a plurality of sensor simulators to generate events for a future proof workload, and an automation framework to future proof the real IoT network by simulating processing of the future proof workload in the simulated IoT network.

Example 82 includes the system of example 81. In some examples, future proofing the workload and the configuration includes generating a model of future applications, and simulating an execution of the workflow on the simulated IoT network using the model of future applications.

Example 83 includes the system of examples 81 or 82, wherein the future expectation includes future target workflows.

Example 84 includes the system of examples 81 through 83, wherein the automation framework is to determine an implication of a future workflow by analyzing statistic characteristics of the simulated execution.

Example 85 includes the system of examples 81 or 82, wherein the automation framework is to predict non-linear solution characteristics triggered by varying input parameters.

Example 86 includes a tangible, non-transitory, computer-readable medium including code executable by a processor to direct the processor to generate a workflow by modifying a real-world workflow to incorporate a future expectation for the workload, generate a simulated Internet of things (IoT) network for future proofing the workload and a configuration for a simulated gateway of the simulated IoT network, generate an event model for an IoT network based on the future proofing workflow, and future proof the workload and the configuration by simulating an execution of the workflow on the simulated IoT network.

Example 87 includes the medium of example 86. In some examples, the workload and the configuration are future proofed by generating a model of future applications, and simulating an execution of the workflow on the simulated IoT network using the model of future applications.

Example 88 includes the medium of examples 86 or 87, wherein the future expectation includes future target workflows.

Example 89 includes an apparatus for representing events that occur in a real world deployment includes means for identifying a real-world workload including a plurality of the events, means for converting a plurality of characteristics of the real-world workload into a plurality of endpoint simulator workloads, means for converting a plurality of gateway hardware characteristics into a plurality of modeling elements for a plurality of simulated Internet of things (IoT) networks, means for performing a simulation for each of the endpoint simulator workloads on each of the simulated IoT networks, means for collecting statistics about the performed simulation of the simulated IoT networks for the endpoint simulator workloads, means for generating a workflow by modifying the real-world workload to incorporate a future expectation for the real-world workload, means for generating a simulated IoT network for future proofing the workload and a configuration for a simulated gateway of the simulated IoT network, means for generating an event model for the simulated IoT network based on the future proofing workflow, and means for future proofing the workload and the configuration by simulating an execution of the workflow on the simulated IoT network.

Example 90 includes the apparatus of example 89 including means for characterizing a performance of the simulated IoT networks for the endpoint simulator workloads.

Examples of Code

The following are only examples and not intended to limit the present techniques. There may be multiple files which run on a device according to the role of the device (client, gateway, or server). In the following example, the code determines solution characteristics for a given set of input workflow parameters and gateway characteristics.

The following code examples include one set of code sections that performs future proofing of IoT networks, and one set of code sections that perform rapid prototyping of IoT networks. Future proofing is identifying an architecture that meets the SLA conditions of a potential future workflow. In an example of future proofing, Code Sections 1-4 determine gateway characteristics that accommodate a given set of input workflow parameters, and expected solution characteristics. These workflow parameters are the set of parameters that a current deployment could use sometime in the future. The expected solution characteristics may be expectations of what a future IoT network architecture may include.

CODE SECTION 1

```
# Find optimal gateway config for a given set of workflow and solution
parameters.
# ML equation: Gi = Wi + Si
```

CODE SECTION 1

```
# Based on the input workflow parameters and expected solution
characteristics,
# calculate gateway characteristics needed for that solution outcome
using Machine
    Learning.
import numpy as np
import statsmodels.api as sm
import xlrd
import pandas as pd
import math
import time
import os
```

Code Section 2 performs linear regressions. There are several independent parameters that will influence a given dependent parameter and the relationship may be a non-linear relationship. In examples, the application of Code Section 2 to edge devices provides for the determination of solution parameters, gateway configuration, publishing characteristics and such to determine an efficient configuration.

CODE SECTION 2

```
#Function to run multiple linear regression
def reg_m(y, x):
    ones = np.ones(len(x[0]))
    x = np.array(x).T
    x = sm.add_constant(x)
    #Linear Regression
    results = sm.OLS(endog=y, exog=x).fit( )
    print "\n ====================================== \n"
    print ("The coefficients
    are : ", results.params)
    print ("The STD errors are : ", results.bse)
    print ("The scale is: ", results.scale)
    print ("The std_error (sqrt(scale)) is: ", math.sqrt(results.scale))
    print "\n ====================================== \n"
    #print results.summary( )
    return results
```

It is noted that Code Section 3 determines gateway characteristics. However, this is merely one example of an architecture element that may be determined. Examples may also, or alternatively, determine the characteristics of other elements of an IoT network architecture.

CODE SECTION 3

```
#Function for Gateway Characteristics calculation
def gw_calc(data, const, sensor, pub, burst, std_err):
    # Create global list of predicted GW CPU values that can be
        used to predict required future GW Architecture.
    global Pred_GW_array = [ ]
    GW_counter = 0
    for arr in data:
        #calculate predicted GW CPU Freq
        pred_gw_freq = const + (arr[0] * sensor) + (arr[1] * pub) +
        (arr[2] * burst)
        print ("Calculated GW_CPU_Freq is: ", pred_gw_freq)
        Pred_GW_array[GW_counter] = pred_gw_freq
        GW_counter += 1
    return
print "Learning in progress..."
```

CODE SECTION 4

```
#Read Workflow and Solution data from Excel sheet.
workbook = xlrd.open_workbook('ProfiledData.xlsx')
worksheet = workbook.sheet_by_name('Solution')
num_cols = worksheet.ncols 1
#Create an array to store all the cols.
Sensor_array = [ ]
Publish_array = [ ]
Burst_array = [ ]
CPU_array = [ ]
S_array = [ ]
P_array = [ ]
B_array = [ ]
A_array = [ ]
#Add each column to an array.
S_array += worksheet.col(0)
P_array += worksheet.col(1)
B_array += worksheet.col(2)
A_array += worksheet.col(3)
for S in S_array:
    Sensor_array.append(S.value)
for P in P_array:
    Publish_array.append(P.value)
for B in B_array:
    Burst_array.append(B.value)
for A in A_array:
    CPU_array.append(A.value)
#Create Predictor array and independent variables.
y = CPU_array
x = [Sensor_array, Publish_array, Burst_array]
#Run regression on the input data.
results = reg_m(y, x)
#Capture the coefficients.
Reg_const = results.params[0]
Reg_sensor = results.params[1]
Reg_pub = results.params[2]
Reg_burst = results. params[3]
#Document required Solution and Workflow characteristics
#Read Workflow and Solution data from Excel sheet.
workbook = xlrd.open_workbook('FutureData.xlsx')
worksheet = workbook.sheet_by_name('Solution')
num_cols = worksheet.ncols 1
#Create an array to store all the cols.
Sensor_array = [ ]
Publish_array = [ ]
Burst_array = [ ]
S_array = [ ]
P_array = [ ]
B_array = [ ]
#Add each column to an array.
S_array += worksheet.col(0)
P_array += worksheet.col(1)
B_array += worksheet.col(2)
for S in S_array:
    Sensor_array.append(S.value)
for P in P_array:
    Publish_array.append(P.value)
for B in B_array:
    Burst_array.append(B.value)
# Create input to ML equation.
# List of Lists, with each nested list having a value from each category
test_arr = list(zip(Sensor_array, Publish_array, Burst_array))
# Calculate Gateway characteristic.
gw_calc(test_arr, Reg_const, Reg_sensor, Reg_pub, Reg_burst,
    math.sqrt(results.scale))
```

In the following example, the Code Sections 5-9 perform rapid prototyping of IoT networks. Specifically, the solution characteristics for a given set of workflow and gateway parameters are estimated.

CODE SECTION 5

```
# Find estimated solution characteristics for a given set of workflow and
    gateway parameters.
# ML equation: Si = Wi + Gi
# Based on the input workflow parameters and gateway characteristics
```

-continued

CODE SECTION 5

```
# calculate solution characteristics using Machine Learning
import numpy as np
import statsmodels.api as sm
import xlrd
import pandas as pd
import math
import time
import os
#Function to run multiple linear regression
def reg_m(y, x):
    ones = np.ones(len(x[0]))
    x = np.array(x).T
    x = sm.add_constant(x)
    #Linear Regression
    results = sm.OLS(endog=y, exog=x).fit( )
    print "\n ===================================== \n"
    print ("The coefficients
    are : ", results.params)
    print ("The STD errors are : ", results.bse)
    print ("The scale is: ", results.scale)
    print ("The std_error (sqrt(scale)) is: ", math.sqrt(results.scale))
    print "\n ===================================== \n"
#print results.summary( )
    return results
```

Code Section 6 shows CPU prediction as one example of how determinations can be done. Similar approaches may be used to make determinations with regard to memory, storage, bandwidth, software, and any other element of an architecture.

CODE SECTION 6

```
#Function for Solution Characteristics (CPU_Total) calculation
def Soln_calc(data, const, sensor, pub, burst, std_err):
    for arr in data:
        #calculate predicted Solution CPU
        pred_soln_cpu = const + (arr[0] * sensor) + (arr[1] * pub) +
        (arr[2] * burst)
        print ("Calculated CPU_Total is: ", pred_soln_cpu)
    return
print "Learning in progress..."
```

CODE SECTION 7

```
#Read Workflow and Gateway profile data from Excel sheet.
workbook = xlrd.open_workbook('RegressionData.xlsx')
worksheet = workbook.sheet_by_name('Test')
num_cols = worksheet.ncols 1
#Create an array to store all the cols.
Sensor_array = [ ]
Publish_array = [ ]
Burst_array = [ ]
Act_CPU_array = [ ]
S_array = [ ]
P_array = [ ]
B_array = [ ]
A_array = [ ]
#Add each column to an array.
S_array += worksheet.col(0)
P_array += worksheet.col(1)
B_array += worksheet.col(2)
A_array += worksheet.col(3)
for S in S_array:
    Sensor_array.append(S.value)
for P in P_array:
    Publish_array.append(P.value)
for B in B_array:
    Burst_array.append(B.value)
for A in A_array:
    Act_CPU_array.append(A.value)
```

CODE SECTION 7

```
#Create Predictor array and independent variables.
y = Act_CPU_array
x = [Sensor_array, Publish_array, Burst_array]
```

Code Section 8 represents a regression run. The outputs of the regression runs are the predictors for the parameters of interest. These resultant parameters are the solution characteristics as observable in a deployment.

CODE SECTION 8

```
#Run regression on the input data.
results = reg_m(y, x)
#Capture the coefficients.
Reg_const = results.params[0]
Reg_sensor = results.params[1]
Reg_pub = results.params[2]
Reg_burst = results.params[3]
```

Code Section 9 detects the actual workflow. This is accomplished using profilers that detect parameter values such as publish rates, payload, header characteristics, CPU, memory usage etc.

CODE SECTION 9

```
#Detect workflow coming in to gateway.
global count,g_avg_pub_freq,g_aprx_pub_freq,g_avg_burst_count,pub_msg
count = (count%10) + 1
for i in range(len(time_list)1):
        time2 = time_list[i+1].split(" ")[0]
        time1 = time_list[i].split(" ")[0]
        exec_time = float((datetime.datetime.strptime(time2, FMT)
                datetime.datetime.strptime(time1, FMT))total_seconds( ))
        exec_time *= 1000
        exec_time_list.append(exec_time)
os.system("clear")
cmd = "netstat lantp | grep E 'mosquitto.*ESTABLISHED|ESTABLISHED.*mosquitto' |
        grep -v'127.0.0.1' |wc I"
proc=Popen(cmd,shell=True,stdout=PIPE, )
num_sensor=int(proc.communicate( )[0]) 1
avg_burst_count = sum(burst_count)/len(burst_count)
if (g_avg_burst_count == 0):
        g_avg_burst_count = avg_burst_count
else:
    g_avg_burst_count = g_avg_burst_count + ( float(avg_burst_count
        g_avg_burst_count) / count)
avg_pub_freq = sum(interval_list)/len(interval_list)
if (g_avg_pub_freq == 0):
        g_avg_pub_freq = avg_pub_freq
else:
        g_avg_pub_freq = g_avg_pub_freq +
        ( float(avg_pub_freq g_avg_pub_freq) / count)
print "Number of sensors: ",num_sensor
print "Avg publish interval: "+ str(g_avg_pub_freq)+" seconds"
print "Avg Burst Count: "+str(g_avg_burst_count)
cpu_usage = psutil.cpu_times_percent( ).user
print "CPU Usage: "+str(cpu_usage)
data_string =
str(num_sensor)+','+str(int(round(g_avg_pub_freq)))+','+str(int(round(g_avg_burst_
        count)))+','+str(int(cpu_usage))
array = [ ]
array.append(data_string.strip( ).split(','))
test_arr = [map(int, x) for x in array]
#Calculate Solution characteristic.
Soln_calc(test_arr, Reg_const, Reg_sensor, Reg_pub, Reg_burst,
        math.sqrt(results.scale))
```

What is claimed is:

1. A method of determining headroom for applications in an Internet of things (IoT) network, comprising:
generating a workflow by modifying a real-world workflow to incorporate a future expectation for a workload of the IoT network;
generating a simulated IoT network for prototyping different potential IoT network configurations including the workload and a configuration for a simulated gateway of the simulated IoT network;
generating an event model for the IoT network based on the workflow;
simulating an execution of the workflow on the simulated IoT network, wherein the simulated IoT network comprises a hybrid of live and emulated components of the IoT network;
evaluating the simulated IoT network to determine architecture and workflow characteristics, and comparing architecture characteristics with a desired technical architecture by performing a lookup in an IoT database, wherein a record in the IoT database includes: a tuple of the workload, observed IoT network performance on the workload, and statistic characteristics of the IoT network performance;
determining whether the statistic characteristics of the IoT network performance exceed a specified threshold of variation from others of the potential IoT network configurations, wherein to determine the variation for the statistical characteristics, the statistical characteristics are compared against statistical characteristics of previously evaluated simulations;
in response to determining that the statistic characteristics of the IoT network performance do not exceed the specified threshold of variation, removing the workflow and configuration for the simulated gateway from the potential IoT network configurations; and
after evaluating a plurality of different simulations, adjusting, based on evaluations of the different simulations, the IoT network to an IoT network configuration that provides a minimum headroom for a future expectation of the workload.

2. The method of claim 1, comprising:
generating a model of future applications; and
simulating an execution of the workflow on the simulated IoT network using the model of future applications.

3. The method of claim 1, wherein the future expectation comprises future target workflows.

4. The method of claim 1, comprising determining an implication of a future workflow by analyzing statistic characteristics of the simulated IoT network.

5. The method of claim 1, comprising predicting non-linear solution characteristics triggered by varying input parameters.

6. A system for prototyping different potential Internet of things (IoT) network configurations in an IoT network, comprising:
a control user interface to define a simulated IoT network associated with a real IoT network;
a plurality of sensor simulators to generate events for a workload of the simulated IoT network; and
an automation framework to modify a real-world workflow to incorporate a future expectation for the workload of the simulated IoT network and to prototype different potential IoT network configurations of the real IoT network by:
simulating processing of the workload in the simulated IoT network,
evaluating the simulated IoT network to determine architecture and workflow characteristics,
comparing the architecture characteristics with a desired technical architecture by performing a lookup in an IoT database, wherein a record in the IoT database includes a tuple of the workload, observed IoT network performance on the workload, and statistic characteristics of the IoT network performance;
determining whether the statistic characteristics of the IoT network performance exceed a specified threshold of variation from others of the potential IoT network configurations, wherein to determine the variation for the statistical characteristics, the statistical characteristics are compared against statistical characteristics of previously evaluated simulations;
in response to determining that the statistic characteristics of the IoT network performance do not exceed a specified threshold of variation, removing aspects of the potential IoT network configuration from the potential IoT network configurations; and
after evaluating a plurality of different simulations, adjusting, based on the evaluations, the simulated IoT network to an IoT network configuration that provides a desired headroom for a future expectation of the workload.

7. The system of claim 6, wherein future proofing the workload and the configuration comprises:
generating a model of future applications; and
simulating an execution of the workflow on the simulated IoT network using the model of future applications, wherein characteristics of the simulated IoT network are associated with a gateway architecture comprising a hybrid of live and simulated components of the simulated IoT network and wherein the gateway architecture characteristics are associated with a gateway architecture comprising a hybrid of live and simulated components of the simulated IoT network.

8. The system of claim 6, wherein the future expectation comprises future target workflows.

9. The system of claim 6, wherein the automation framework is used to determine an implication of a future workflow by analyzing statistic characteristics of the simulated IoT network.

10. The system of claim 6, wherein the automation framework is used to predict non-linear solution characteristics triggered by varying input parameters.

11. A tangible, non-transitory, computer-readable medium comprising code executable by a processor to direct the processor to:
generate a workflow by modifying a real-world workflow to incorporate a future expectation for a workload of an Internet of things (IoT) network;
generate a simulated IoT network for prototyping different potential IoT network configurations including the workload and a configuration for a simulated gateway of the simulated IoT network;
generate an event model for the simulated IoT network based on the workflow;
simulate an execution of the workflow on the simulated IoT network, wherein the simulated IoT network comprises a hybrid of live and emulated components of the simulated IoT network;
evaluate the simulated IoT network to determine architecture and workflow characteristics, and compare the architecture characteristics with a desired technical architecture by performing a lookup in an IoT database, wherein a record in the IoT database includes a tuple of the workload, observed IoT network performance on the workload, and statistic characteristics of the IoT network performance;

determine whether the statistic characteristics of the IoT network performance exceed a specified threshold of variation from others of the potential IoT network configurations, wherein to determine the variation for the statistical characteristics, the statistical characteristics are compared against statistical characteristics of previously evaluated simulations;

in response to a determination that the statistic characteristics of the IoT network performance do not exceed a specified threshold of variation, remove the workflow and configuration for the simulated gateway from the potential IoT network configurations; and after evaluating a plurality of different simulations, adjust, based on the evaluations, the IoT network to an IoT network configuration that provides a desired headroom for a future expectation of the workload.

12. The medium of claim 11, comprising code executable by a processor to direct the processor to:
generate a model of future applications; and
simulate an execution of the workflow on the simulated IoT network using the model of future applications.

13. The medium of claim 11, wherein the future expectation comprises future target workflows.

14. The medium of claim 11, comprising code executable by the processor to determine an implication of a future workflow by analyzing statistic characteristics of the simulated execution.

15. The medium of claim 11, comprising code executable by the processor to predict non-linear solution characteristics triggered by varying input parameters.

16. A method of representing events that occur in a real world deployment in an Internet of things (IoT) network, comprising:
identifying a real-world workload of the IoT network comprising a plurality of the events;
converting a plurality of characteristics of the real-world workload into a plurality of endpoint simulator workloads;
converting a plurality of gateway hardware characteristics into a plurality of modeling elements for a plurality of simulated IoT networks;
performing a simulation for each of the endpoint simulator workloads on each of the plurality of simulated IoT networks;
collecting statistics about the performed simulation of the plurality of simulated IoT networks for the endpoint simulator workloads;
generating a workflow by modifying the real-world workload to incorporate a future expectation for the real-world workload of the IoT network;
generating a simulated IoT network for prototyping different potential IoT network configurations including the real-world workload and a configuration for a simulated gateway of each of the simulated IoT networks;

generating an event model for the simulated IoT network based on the real-world workflow;

simulating an execution of the real-world workflow on the simulated IoT network, wherein the simulated IoT network comprises a hybrid of live and emulated components of the IoT network;

evaluating the simulated IoT network to determine architecture and workflow characteristics, and comparing the architecture characteristics with a desired technical architecture by performing a lookup in an IoT database, wherein a record in the IoT database includes a tuple of the workload, observed IoT network performance on the workload, and statistic characteristics of the IoT network performance;

determining whether the statistic characteristics of the IoT network performance exceed a specified threshold of variation from others of the potential IoT network configurations, wherein to determine the variation for the statistical characteristics, the statistical characteristics are compared against statistical characteristics of previously evaluated simulations;

in response to determining that the statistic characteristics of the IoT network performance do not exceed the specified threshold of variation, removing the workflow and configuration for the simulated gateway from the potential IoT network configurations; and after evaluating a plurality of different simulations, adjusting, based on the evaluations, the IoT network to an IoT network configuration that provides a desired headroom for a future expectation of the workload.

17. The method of claim 16 comprising characterizing a performance of the simulated IoT networks for the endpoint simulator workloads.

18. The method of claim 17, comprising modifying a sensed value of an event in the endpoint simulator workload via a user interface.

19. The method of claim 16, comprising generating events that trigger multiple simultaneous triggers.

20. The method of claim 16, comprising deterministically simulating multiple triggers.

21. The method of claim 16, comprising deterministically evaluating statistics from simultaneous variations of multiple triggers.

22. The method of claim 16, comprising determining the statistics for the simulation.

23. The method of claim 16, comprising eliminating workloads and gateway metrics that do not change the statistics.

24. The method of claim 16, comprising performing the simulations in parallel what-if analysis runs.

25. The method of claim 24, wherein the simulated IoT networks comprise IoT sensors wirelessly coupled to an aggregation device, and wherein the IoT sensors comprise at least one simulated IoT sensor.

* * * * *